United States Patent
Uchida et al.

(10) Patent No.: US 9,462,364 B2
(45) Date of Patent: *Oct. 4, 2016

(54) CAPACITANCE TYPE SENSOR, ACOUSTIC SENSOR, AND MICROPHONE

(71) Applicant: OMRON Corporation, Kyoto-shi, Kyoto (JP)

(72) Inventors: Yuki Uchida, Kyoto (JP); Takashi Kasai, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/426,536

(22) PCT Filed: Aug. 12, 2013

(86) PCT No.: PCT/JP2013/071830
§ 371 (c)(1),
(2) Date: Mar. 6, 2015

(87) PCT Pub. No.: WO2014/041943
PCT Pub. Date: Mar. 20, 2014

(65) Prior Publication Data
US 2015/0245123 A1    Aug. 27, 2015

(30) Foreign Application Priority Data

Sep. 14, 2012  (JP) ................................. 2012-202978

(51) Int. Cl.
| | |
|---|---|
| *H04R 25/00* | (2006.01) |
| *H04R 1/08* | (2006.01) |
| *H04R 19/00* | (2006.01) |
| *H04R 7/06* | (2006.01) |
| *H04R 7/12* | (2006.01) |
| *H04R 19/04* | (2006.01) |
| *H01L 29/84* | (2006.01) |

(52) U.S. Cl.
CPC .............. *H04R 1/08* (2013.01); *H04R 19/005* (2013.01); *H01L 29/84* (2013.01); *H04R 7/06* (2013.01); *H04R 7/122* (2013.01); *H04R 19/04* (2013.01)

(58) Field of Classification Search
CPC .. H04R 1/406; H04R 19/005; H04R 19/016; H04R 19/04; H04R 23/006; H04R 2201/003; H04R 31/003; B81B 2201/0257
USPC ....... 381/113, 116, 369, 173, 174, 175, 191; 29/25.41, 25.42, 594; 367/170, 174, 367/181; 438/53; 257/416
See application file for complete search history.

(56) References Cited

U.S. PATENT DOCUMENTS

| | | | |
|---|---|---|---|
| 6,535,460 B2 * | 3/2003 | Loeppert ............... | B81B 3/0072 367/181 |
| 8,351,625 B2 * | 1/2013 | Kasai .................... | H04R 19/04 381/175 |

(Continued)

FOREIGN PATENT DOCUMENTS

JP   2008-245267 A   10/2008

OTHER PUBLICATIONS

International Search Report issued in corresponding application No. PCT/JP2013/071830, mailed Sep. 24, 2013 (2 pages).

*Primary Examiner* — Sunita Joshi
(74) *Attorney, Agent, or Firm* — Osha Liang LLP

(57) ABSTRACT

A capacitance type sensor has a substrate, a vibration electrode plate formed over the substrate, a back plate formed over the substrate so as to cover the vibration electrode plate, and a fixed electrode plate provided on the back plate so as to be opposite to the vibration electrode plate. At least one of the vibration electrode plate and the fixed electrode plate is separated into a plurality of regions, each of the plurality of regions being formed with a sensing section including the vibration electrode plate and the fixed electrode plate. A barrier electrode is provided between respective sensing sections of at least one adjacent pair of regions of the plurality of regions to prevent signal interference between the respective sensing sections.

19 Claims, 30 Drawing Sheets

(56) References Cited

U.S. PATENT DOCUMENTS

| | | | | |
|---|---|---|---|---|
| 8,542,851 B2 * | 9/2013 | Kasai | ............... | H04R 19/005 381/175 |
| 2007/0047746 A1 | 3/2007 | Weigold et al. | | |
| 2007/0189556 A1 * | 8/2007 | Tsuchiya | .............. | H04R 31/006 381/174 |
| 2009/0316916 A1 | 12/2009 | Haila et al. | | |
| 2010/0183167 A1 | 7/2010 | Phelps et al. | | |

* cited by examiner

Fig. 3
(A)
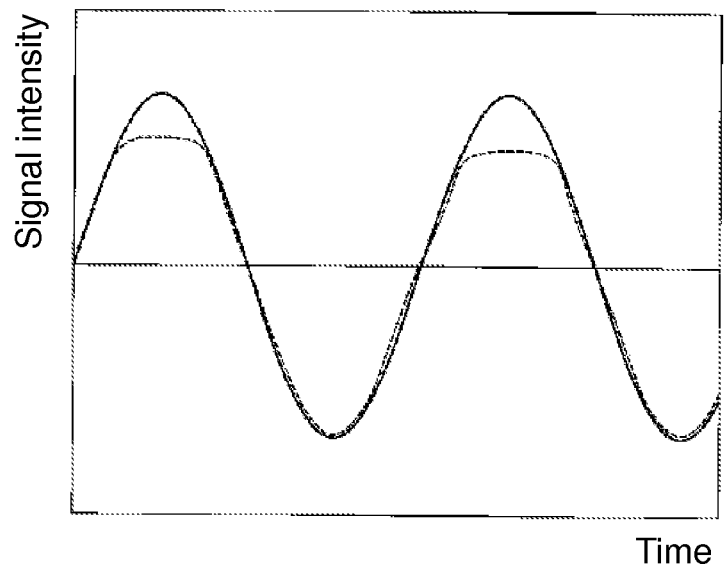
(B)
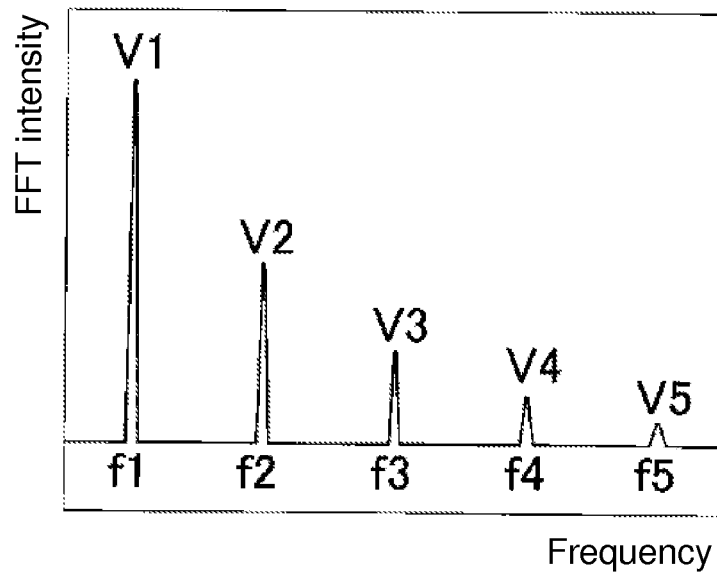

CAPACITANCE TYPE SENSOR, ACOUSTIC SENSOR, AND MICROPHONE

CROSS-REFERENCE TO RELATED APPLICATIONS

This is a national stage application of PCT Application No. PCT/JP2013/071830, with an International filing date of Aug. 12, 2013, which claims priority of Japanese Patent Application No. 2012-202978 filed on Sep. 14, 2012, the entire content of which is hereby incorporated by reference.

BACKGROUND

1. Technical Field

The present invention relates to a capacitance type sensor, an acoustic sensor, and a microphone. More specifically, the present invention relates to a capacitance type sensor of a capacitor structure including a vibration electrode plate (diaphragm) and a fixed electrode plate. In addition, the present invention relates to an acoustic sensor which converts acoustic vibration to an electric signal to output the electric signal, and a microphone using the acoustic sensor. In particular, the present invention relates to a capacitance type sensor and an acoustic sensor of very small size manufactured by using MEMS (Micro Electro Mechanical System) technique.

2. Related Art

As small microphones incorporated into mobile phones, electret condenser microphones have been widely used. However, the electret condenser microphones are heat-sensitive, and are inferior to MEMS microphones in point of coping with digitization, miniaturization, advanced and more functions, and electric power saving. Therefore, at present, the MEMS microphones are becoming widespread.

The MEMS microphones have an acoustic sensor (acoustic transducer) which detects acoustic vibration to convert it to an electric signal (detection signal), a drive circuit which applies a voltage to the acoustic sensor, and a signal processing circuit which subjects the detection signal from the acoustic sensor to signal processing, such as amplification, to output the processed signal to the outside. The acoustic sensor used for the MEMS microphones is a capacitance type acoustic sensor manufactured by using MEMS technique. In addition, the drive circuit and the signal processing circuit are integrally manufactured as an ASIC (Application Specific Integrated Circuit) by using a semiconductor manufacturing technique.

In recent years, the microphones are required to detect sounds ranging from low sound pressure to high sound pressure at high sensitivity. The maximum input sound pressure of the microphones is typically limited according to a total harmonic distortion. This is because harmonic distortion is caused in an output signal when the microphones detect a sound having a high sound pressure, resulting in deteriorating sound quality and accuracy. Therefore, when the total harmonic distortion can be reduced, the maximum input sound pressure can be higher to widen the detection sound pressure range (hereinafter, dynamic range) of the microphones.

However, in the typical microphones, a trade-off relation exists between improvement in acoustic vibration detection sensitivity and reduction in total harmonic distortion. Consequently, in the high-sensitivity microphone which can detect a sound having a low sound volume (low sound pressure), the total harmonic distortion in an output signal becomes higher at the time of entering of a high-volume sound, resulting in limiting the maximum detection sound pressure. This is because the output signal of the high-sensitivity microphone becomes greater to be likely to cause harmonic distortion. On the contrary, when the maximum detection sound pressure is increased by reducing the harmonic distortion in an output signal, the sensitivity of the microphone becomes lower to make detection of a sound having a low sound volume at high quality difficult. As a result, the typical microphones are difficult to have a wide dynamic range from low sound volume (low sound pressure) to high sound volume (high sound pressure).

Under such a technical background, to have the wide dynamic range, microphones using a plurality of acoustic sensors having different detection sensitivities have been studied. Such microphones are disclosed in e.g., Patent Documents 1 to 4.

Patent Documents 1 and 2 disclose the microphone which is provided with a plurality of acoustic sensors and switches or combines a plurality of signals from the acoustic sensors according to sound pressure. Such a microphone has a detectable sound pressure level (SPL) of approximately 30 dB to 140 dB by switching a high-sensitivity acoustic sensor having a detectable sound pressure level of approximately 30 dB to 115 dB and a low-sensitivity acoustic sensor having a detectable sound pressure level of approximately 60 dB to 140 dB. In addition, Patent Documents 3 and 4 disclose the microphone which has a plurality of independent acoustic sensors formed over one chip.

FIG. 1A shows the relation between the total harmonic distortion and the sound pressure in the high-sensitivity acoustic sensor of Patent Document 1. FIG. 1B shows the relation between the total harmonic distortion and the sound pressure in the low-sensitivity acoustic sensor of Patent Document 1. FIG. 2 shows the relation between the average displacement amount of diaphragms and the sound pressure in the high-sensitivity acoustic sensor and the low-sensitivity acoustic sensor of Patent Document 1. When the allowed total harmonic distortion is 20%, the maximum detection sound pressure of the high-sensitivity acoustic sensor is approximately 115 dB. The high-sensitivity acoustic sensor has a minimum detection sound pressure of approximately 30 dB because when the sound pressure is lower than approximately 30 dB, the S/N ratio is deteriorated. Therefore, as shown in FIG. 1A, the dynamic range of the high-sensitivity acoustic sensor is approximately 30 dB to 115 dB. Likewise, when the allowed total harmonic distortion is 20%, the maximum detection sound pressure of the low-sensitivity acoustic sensor is approximately 140 dB. The diaphragm of the low-sensitivity acoustic sensor has a smaller area than the high-sensitivity acoustic sensor, and as shown in FIG. 2, has a smaller average displacement amount than the high-sensitivity acoustic sensor. Therefore, the minimum detection sound pressure of the low-sensitivity acoustic sensor is higher than the minimum detection sound pressure of the high-sensitivity acoustic sensor, and is approximately 60 dB. As a result, as shown in FIG. 1B, the dynamic range of the low-sensitivity acoustic sensor is approximately 60 dB to 140 dB. When the high-sensitivity acoustic sensor is combined with the low-sensitivity acoustic sensor, as shown in FIG. 1C, the detectable sound pressure range becomes wider and is approximately 30 dB to 140 dB.

The total harmonic distortion is defined as follows. The waveform indicated by the solid line in FIG. 3A is a basic sine waveform at frequency f1. When the basic sine waveform system is Fourier transformed, a spectrum component appears only in the position of frequency f1. Assume that the basic sine waveform in FIG. 3A is distorted due to some cause like the waveform indicated by the dashed line in FIG. 3A. When the distortion waveform is Fourier transformed, the frequency spectrum in FIG. 3B is obtained. That is, assume that the distortion waveform has FFT intensities (fast Fourier transformation intensities) of V1, V2, ..., V5 at frequencies f1, f2, ..., f5, respectively. At this time, total harmonic distortion THD of the distortion waveform is defined by the following equation 1.

$$THD = \frac{\sqrt{V2^2 + V3^2 + V4^2 + V5^2}}{V1} \qquad \text{(Equation 1)}$$

PATENT DOCUMENTS

Patent Document 1: U.S. Patent No. 2009/0316916
Patent Document 2: U.S. Patent No. 2010/0183167
Patent Document 3: Japanese Unexamined Patent Publication No. 2008-245267
Patent Document 4: U.S. Patent No. 2007/0047746

SUMMARY OF THE INVENTION

However, in the microphones described in Patent Documents 1 to 4, even when the acoustic sensors are formed over different chips or are integrally formed over one chip (substrate), they have independent capacitor structures. Therefore, in these microphones, acoustic characteristic variation and mismatch are caused. Here, the acoustic characteristic variation is referred to as the acoustic characteristic deviation between the acoustic sensors between the chips. In addition, the acoustic characteristic mismatch is referred to as the acoustic characteristic deviation between the acoustic sensors in the same chip.

Specifically, when the acoustic sensors are formed over different chips, the detection sensitivities of the chips are varied due to warp and thickness variation of the diaphragms manufactured. As a result, the detection sensitivity difference between the acoustic sensors in the chips becomes greater. In addition, even when the independent acoustic sensors are integrally formed over the shared chip, the gap distances between the diaphragms and the fixed electrode plates are likely to be varied when the capacitor structures of the acoustic sensors are manufactured by using MEMS technique. Further, mismatch of the frequency characteristic and the acoustic characteristic, such as phase, influenced by the back chamber and the vent hole which are individually formed is caused in the chip.

According to one or more embodiments of the present invention, a capacitance type sensor and an acoustic sensor which integrally form a plurality of sensing sections having different sensitivities, has a wide dynamic range and less mismatch between the sensing sections, and can prevent a leak signal between the sensing sections.

A capacitance type sensor according to one or more embodiments of the present invention includes a substrate, a vibration electrode plate formed over the substrate, a back plate formed over the substrate so as to cover the vibration electrode plate, and a fixed electrode plate provided on the back plate so as to be opposite to the vibration electrode plate, in which at least one of the vibration electrode plate and the fixed electrode plate (that is, any one of or both the vibration electrode plate and the fixed electrode plate) is separated into a plurality of regions, each separated region being formed with a sensing section including the vibration electrode plate and the fixed electrode plate, in which a barrier electrode is provided between at least one pair of adjacent sensing sections (that is, one or more pairs of sensing sections) and prevents signal interference between the sensing sections.

In the capacitance type sensor according to one or more embodiments of the present invention, at least one of the vibration electrode plate and the fixed electrode plate is separated into a plurality of regions. The sensing sections (of a variable capacitor structure) are thus formed between the separated regions of the vibration electrode plate or the fixed electrode plate. Therefore, the separated sensing sections can output electric signals to convert the change in pressure, such as acoustic vibration, to a plurality of electric signals for output. According to such a capacitance type sensor, for instance, the separated regions of the vibration electrode plate are different in area and displacement amount. The sensing sections can thus be different in detection range and sensitivity. By switching or combining the signals, the detection range can be wider without lowering the sensitivity.

In addition, the sensing sections are formed by separating one of the vibration electrode plate and the fixed electrode plate manufactured at the same time. Therefore, as compared with the conventional technique having a plurality of independent sensing sections manufactured separately, the characteristic variation of the sensing sections becomes lesser. As a result, the characteristic variation caused by the detection sensitivity difference between the sensing sections can be lesser. Further, the sensing sections share the vibration electrode plate and the fixed electrode plate. Therefore, mismatch of the frequency characteristic and the phase characteristic can be reduced.

In the capacitance type sensor according to one or more embodiments of the present invention, a barrier electrode is provided between at least one pair of adjacent sensing sections, and prevents signal interference between the sensing sections. Therefore, a leak signal transmitted from one of the sensing sections (e.g., the sensing section on the high sensitivity side) to the other sensing section (e.g., the sensing section on the low sensitivity side) can be released from the barrier electrode to a ground. Therefore, the output signal of the other sensing section can be prevented from being distorted to reduce the total harmonic distortion. Sensitivity change due to the leak signal can also be prevented.

In a capacitance type sensor according to one or more embodiments of the present invention, the fixed electrode plate is separated into a plurality of regions, the barrier electrode being provided between the separated regions of the fixed electrode plate. When the fixed electrode plate is separated into a plurality of regions, a leak signal is transmitted to between the sensing sections through the fixed electrode plate. Therefore, in such a form, according to one or more embodiments of the present invention, the barrier electrode is arranged between the separated regions of the fixed electrode plate.

In a capacitance type sensor according to one or more embodiments of the present invention, the barrier electrode is located in the same plane as the fixed electrode plate. When the fixed electrode plate is separated into a plurality of regions, a leak signal is transmitted to between the separated regions of the fixed electrode plate in the shortest path. Therefore, it is effective that the barrier electrode is arranged in the same plane as the fixed electrode plate. In addition, when the barrier electrode is arranged in the same plane as the fixed electrode plate, it can be manufactured by the same process with the same material as the fixed electrode plate. The sensor manufacturing process can thus be simplified.

In a capacitance type sensor according to one or more embodiments of the present invention, the barrier electrode surrounds at least one of the separated regions of the fixed electrode plate. In one or more embodiments of the present invention, the effect of preventing a leak signal from being transmitted from one of the sensing sections to the other sensing section can be higher.

In a capacitance type sensor according to one or more embodiments of the present invention, the vibration electrode plate is separated into a plurality of regions, the barrier electrode being provided between the separated regions of the vibration electrode plate. When the vibration electrode plate is separated into a plurality of regions, a leak signal is transmitted to between the sensing sections through the vibration electrode plate. Therefore, in such a form, according to one or more embodiments of the present invention, the barrier electrode is arranged between the separated regions of the vibration electrode plate.

In a capacitance type sensor according to one or more embodiments of the present invention, the barrier electrode is located in the same plane as the vibration electrode plate. When the vibration electrode plate is separated into a plurality of regions, a leak signal is transmitted to between the separated regions of the vibration electrode plate in the shortest path. Therefore, it is effective that the barrier electrode is arranged in the same plane as the vibration electrode plate. In addition, when the barrier electrode is arranged in the same plane as the vibration electrode plate, it can be manufactured by the same process with the same material as the vibration electrode plate. The sensor manufacturing process can thus be simplified.

In a capacitance type sensor according to one or more embodiments of the present invention, the barrier electrode surrounds at least one of the separated regions of the vibration electrode plate. In one or more embodiments of the present invention, the effect of preventing a leak signal from being transmitted from one of the sensing sections to the other sensing section can be higher.

In a capacitance type sensor according to one or more embodiments of the present invention, the barrier electrode is held at a reference potential or at the same potential as any one of the vibration electrode plate and the fixed electrode plate. In particular, the barrier electrode is desirably connected at the reference potential, such as the ground.

To interrupt a leak signal transmitted to between the separated regions of the vibration electrode plate and a leak signal transmitted to between the separated regions of the fixed electrode plate, according to one or more embodiments of the present invention, the barrier electrode is provided in the entire path. Therefore, in a capacitance type sensor according to one or more embodiments of the present invention, the barrier electrode is longer than the length of one side of each separated region of the vibration electrode plate or the fixed electrode plate.

A stress concentrates onto the end of the barrier electrode due to residual stress and drop impact, resulting in causing a crack. To prevent this, in a capacitance type sensor according to one or more embodiments of the present invention, the end of the barrier electrode is desirably formed in an arc shape.

In a capacitance type sensor according to one or more embodiments of the present invention, insulating stoppers are projected from the barrier electrode provided between the separated regions of the fixed electrode plate toward the separated regions of the vibration electrode plate. In addition, the insulating stoppers may be projected from the region of the fixed electrode plate along the barrier electrode toward the separated regions of the vibration electrode plate. Below the separated regions of the fixed electrode plate, a slit is typically provided in the vibration electrode plate so as to be opposite to the separated regions of the fixed electrode plate. The edges of the slit in the vibration electrode plate are likely to be stuck to the separated regions of the fixed electrode plate. Therefore, the stoppers are desirably projected from the barrier electrode or from its peripheral portion to prevent the vibration electrode plate from being stuck.

In a capacitance type sensor according to one or more embodiments of the present invention, a slit-like opening is extended through the barrier electrode and the back plate along the length direction of the barrier electrode. In addition, the slit-like opening extended through the back plate may be provided so as to be in parallel with the length direction of the barrier electrode. By providing such a slit-like opening, mechanical vibration, in particular, distortion vibration, is unlikely to be transmitted from the back plate of one of the adjacent sensing sections to the back plate of the other sensing section. Therefore, the total harmonic distortion of the sensing section which receives the vibration can be prevented from being deteriorated.

An acoustic sensor according to one or more embodiments of the present invention uses the capacitance type sensor according to one or more embodiments of the present invention, in which a plurality of perforations are formed in the back plate and the fixed electrode plate and pass acoustic vibration therethrough, in which a signal is outputted from each sensing section according to the change in electrostatic capacitance between the vibration electrode plate which senses the acoustic vibration and the fixed electrode plate.

The acoustic sensor according to one or more embodiments of the present invention uses the capacitance type sensor according to one or more embodiments of the present invention. Therefore, the acoustic sensor has the same operation effect as the capacitance type sensor according to one or more embodiments of the present invention. In particular, a leak signal transmitted from one of the sensing sections to the other sensing section can be released from the barrier electrode to the ground. Therefore, the output signal of the other sensing section can be prevented from being distorted, thereby reducing the total harmonic distortion. Sensitivity change due to the leak signal can also be prevented.

A microphone according to one or more embodiments of the present invention includes the acoustic sensor according to one or more embodiments of the present invention, and a circuit which amplifies a signal from the acoustic sensor to output the amplified signal to the outside. In the microphone according to one or more embodiments of the present invention, the harmonic distortion in the sensing section on the low sensitivity side due to a leak signal from the sensing section on the high sensitivity side can be prevented from being increased. Sensitivity change due to the leak signal can also be prevented.

Various combinations of above elements are within the scope of the present invention.

BRIEF DESCRIPTION OF THE DRAWINGS

FIG. 3A is a graph showing a waveform including a basic waveform and distortion, and FIG. 3B is a frequency spectrum graph of the waveform shown in FIG. 3A.

DETAILED DESCRIPTION

Hereinafter, embodiments of the present invention will be described with reference to the accompanying drawings. However, the present invention is not limited to the following embodiments and various design changes can be made in the range not departing from the scope of the present invention. In particular, one or more embodiments of the present invention will be described by taking an acoustic sensor and a microphone as an example. However, one or more embodiments of the present invention is applicable to a capacitance type sensor, such as a pressure sensor, other than the acoustic sensor. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

Figure 1:
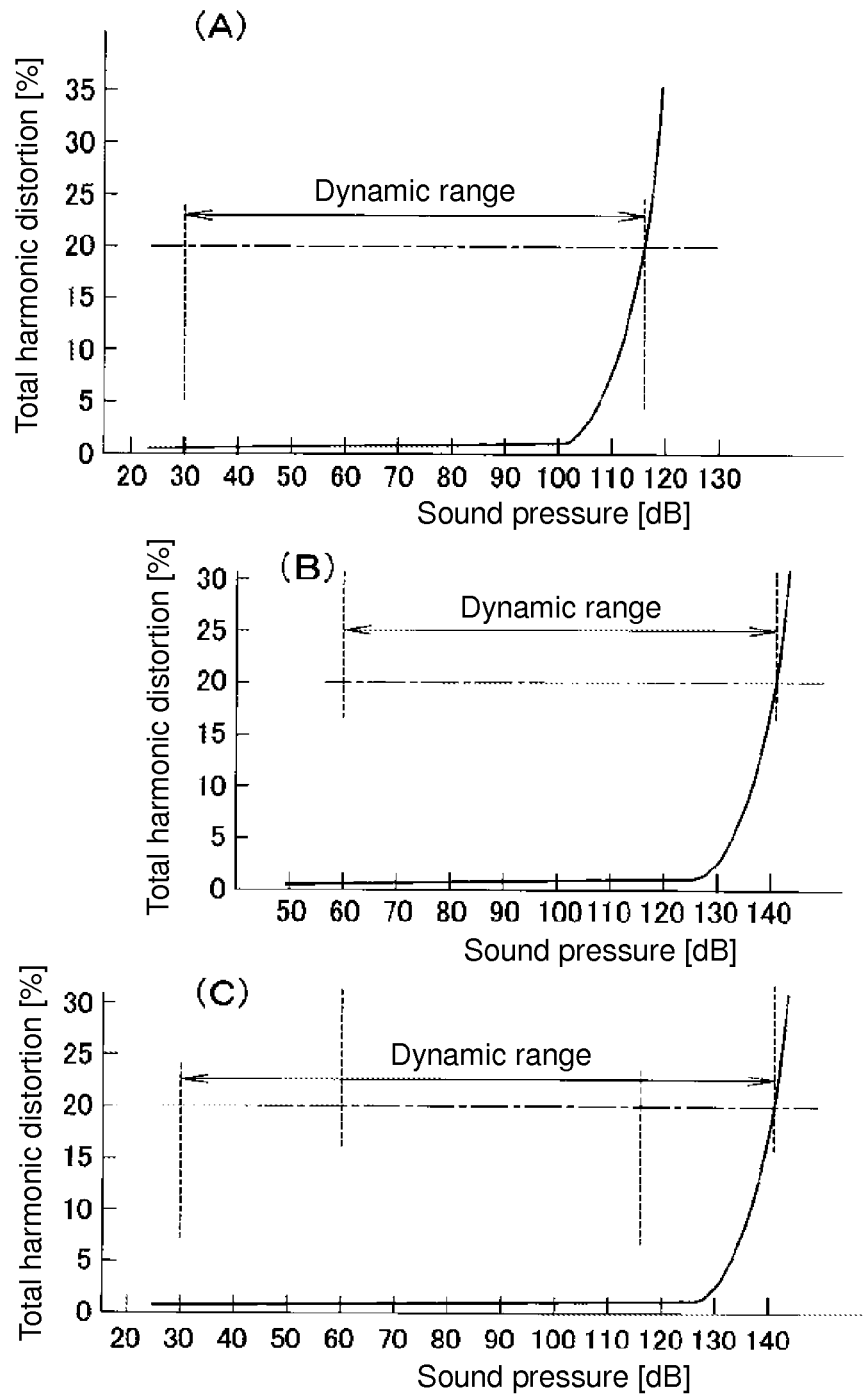
FIG. 1A is a graph showing the relation between the total harmonic distortion and the sound pressure in a high-sensitivity acoustic sensor of Patent Document 1.
FIG. 1B is a graph showing the relation between the total harmonic distortion and the sound pressure in a low-sensitivity acoustic sensor of Patent Document 1.
FIG. 1C is a graph showing the relation between the total harmonic distortion and the sound pressure in the high-sensitivity acoustic sensor and the low-sensitivity acoustic sensor of Patent Document 1 which are combined with each other.
Figure 2:
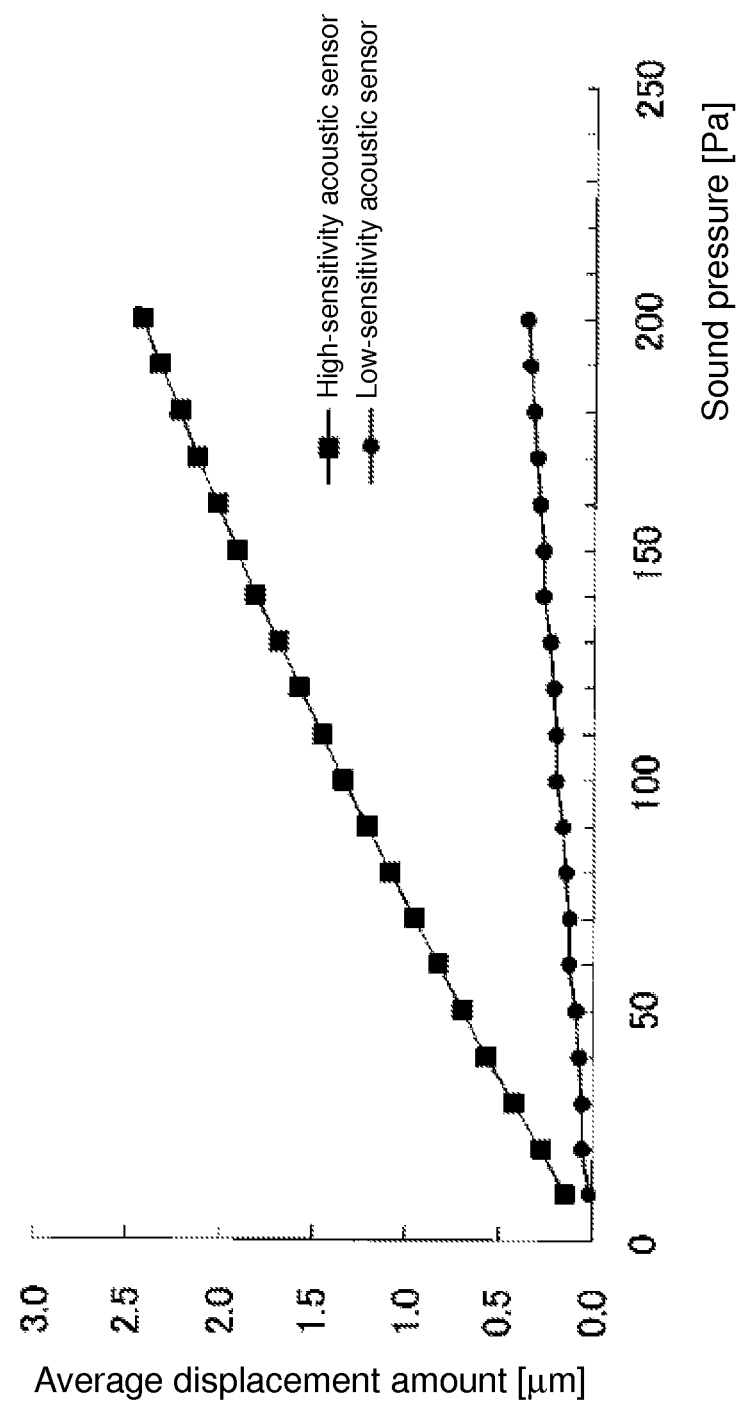
FIG. 2 is a graph showing the relation between the average displacement amount of diaphragms and the sound pressure in the high-sensitivity acoustic sensor and the low-sensitivity acoustic sensor of Patent Document 1.
Figure 4:
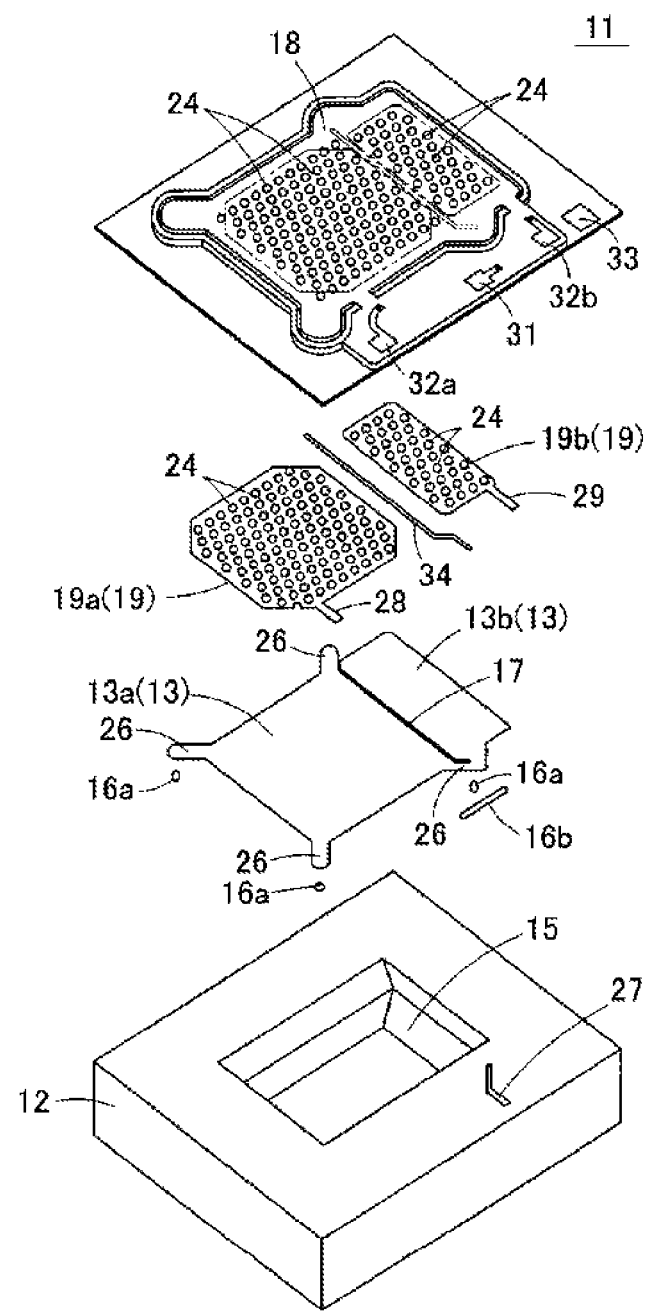
FIG. 4 is an exploded perspective view of an acoustic sensor according to a first embodiment of the present invention.
Figure 5:
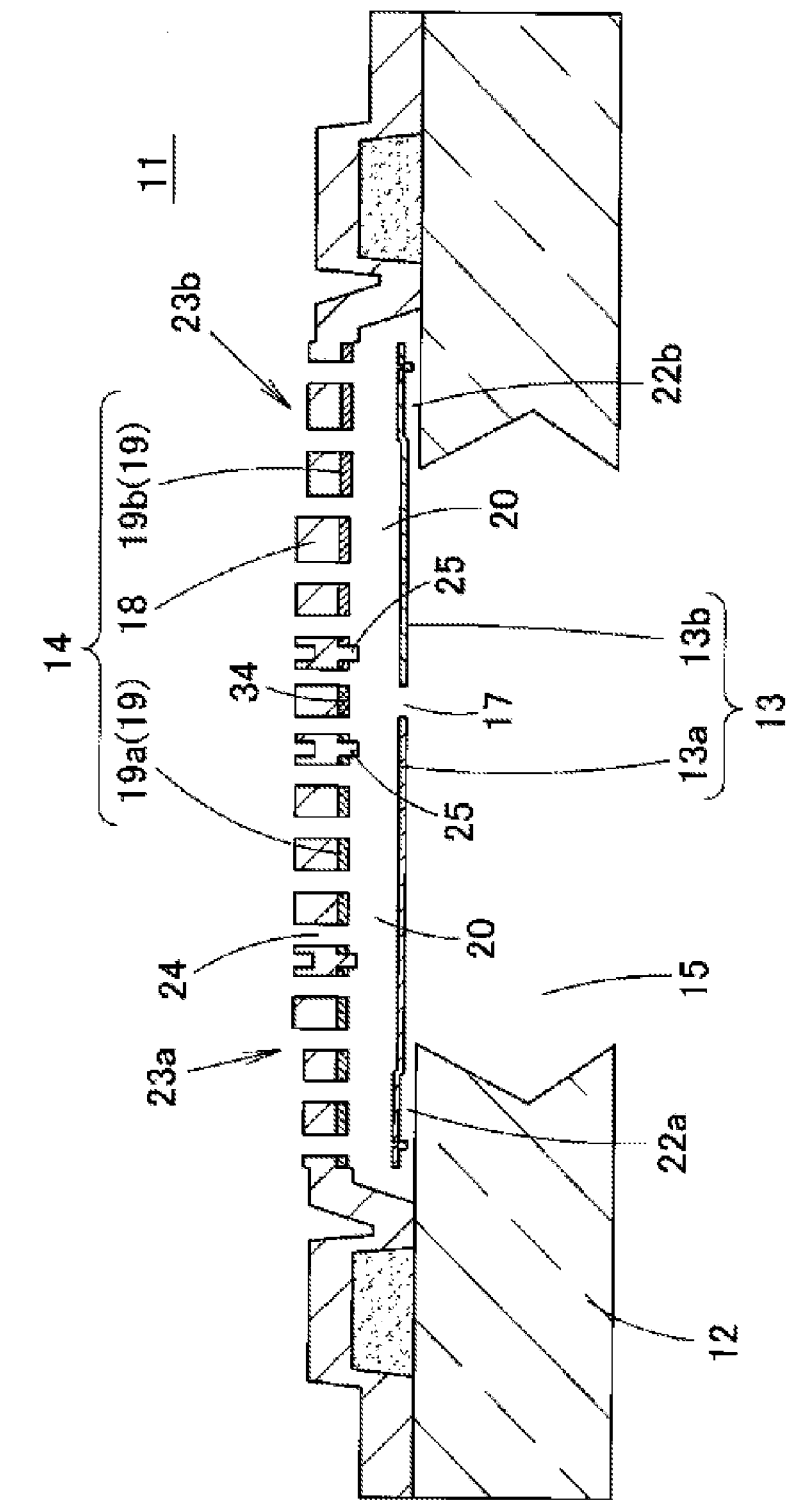
FIG. 5 is a cross-sectional view of the acoustic sensor according to the first embodiment of the present invention.
Figure 6:
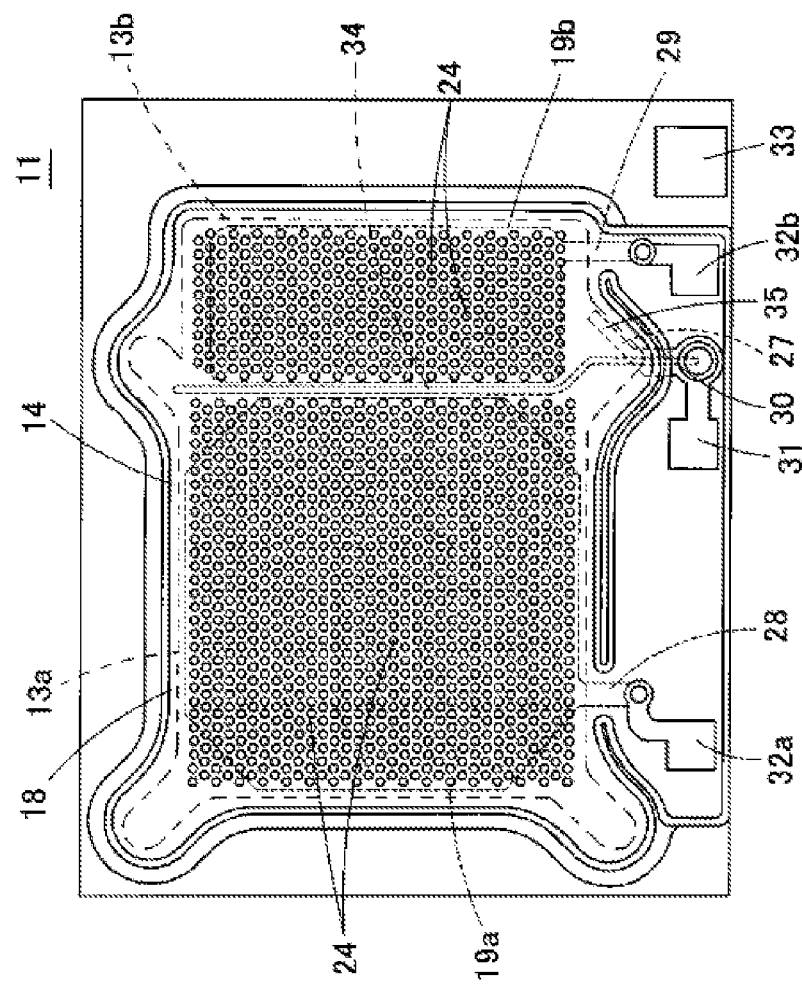
FIG. 6 is a plan view of the acoustic sensor according to the first embodiment of the present invention.
Figure 7:
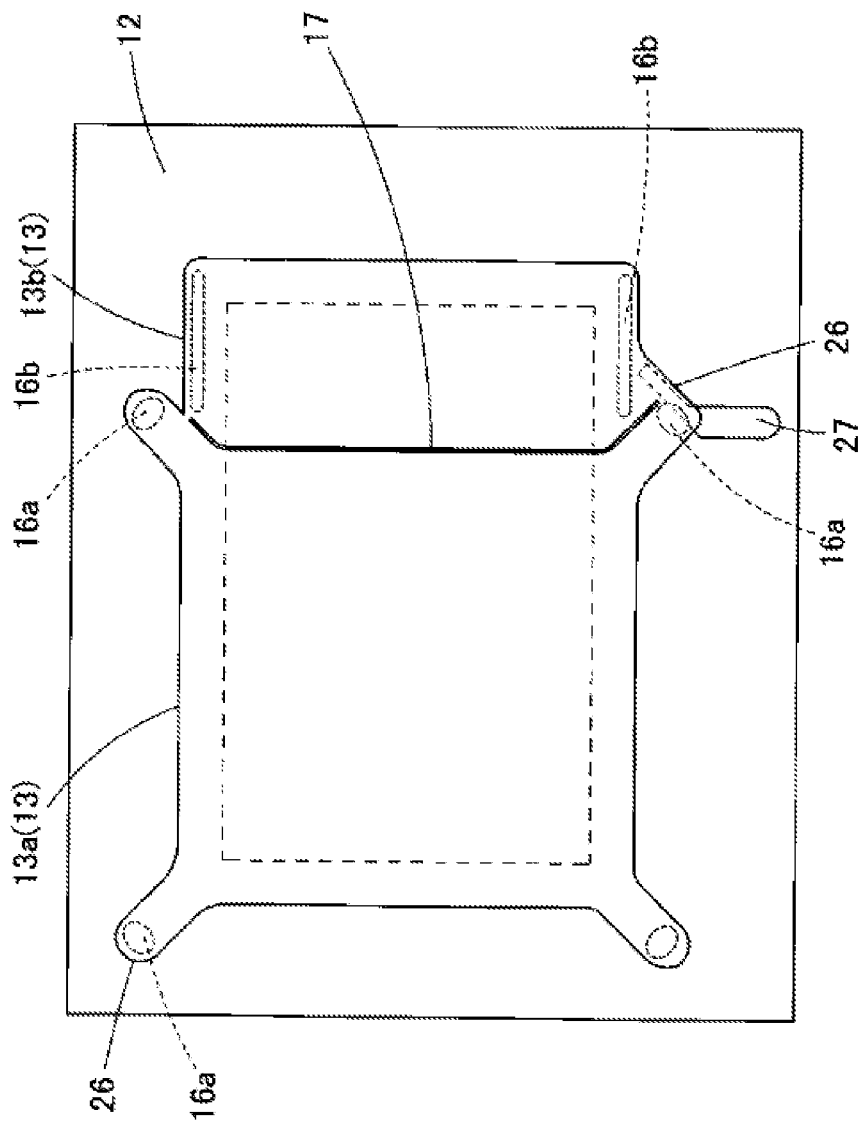
FIG. 7 is a plan view showing a diaphragm formed over a silicon substrate.
Figure 8:
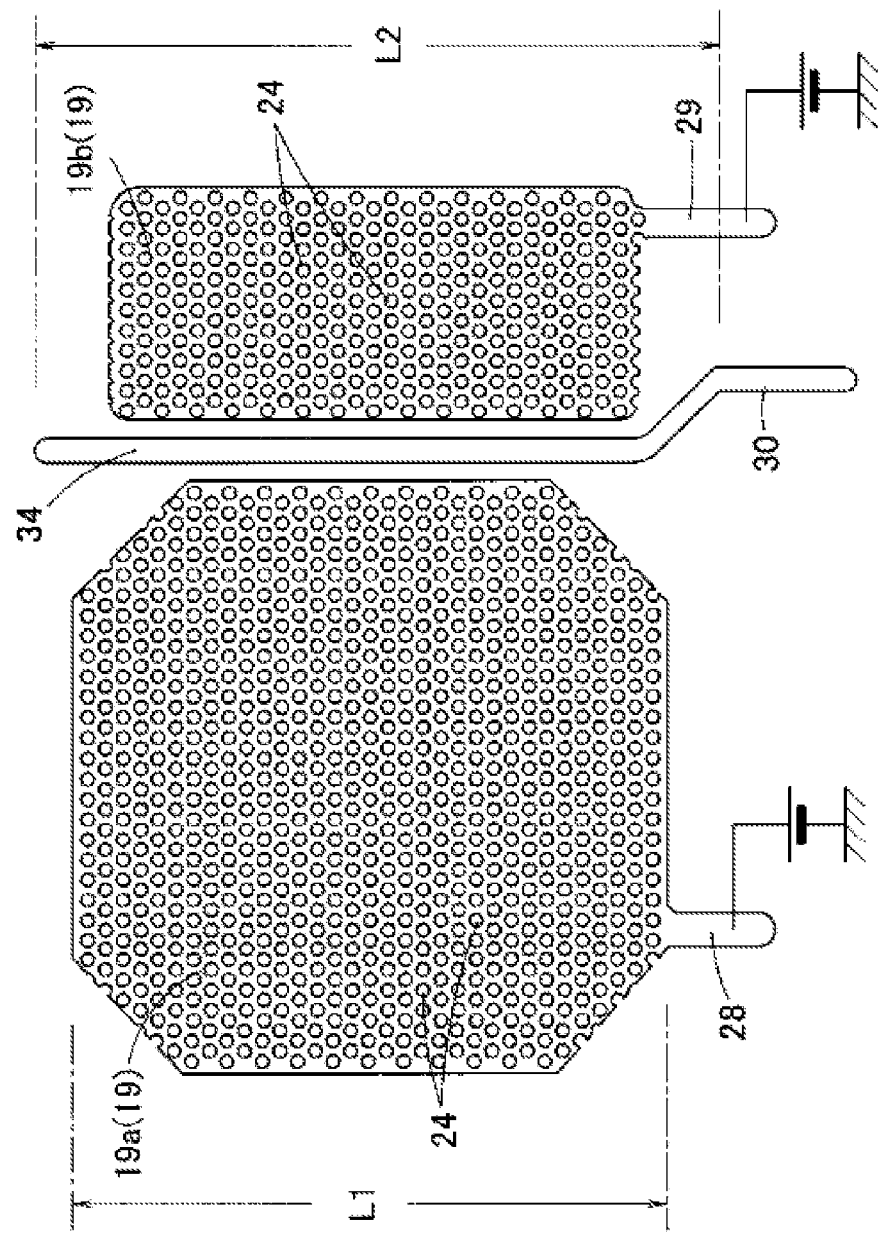
FIG. 8 is a plan view showing the structure of a fixed electrode plate opposite to the diaphragm.

Hereinafter, the structure of an acoustic sensor according to a first embodiment of the present invention will be described with reference to FIGS. 4 to 8. FIG. 4 is an exploded perspective view of an acoustic sensor 11 according to the first embodiment of the present invention. FIG. 5 is a cross-sectional view of the acoustic sensor 11. FIG. 6 is a plan view of the acoustic sensor 11. FIG. 7 is a plan view showing a diaphragm 13 formed over a silicon substrate 12. FIG. 8 is a plan view showing a first fixed electrode plate 19a, a second fixed electrode plate 19b, and a barrier electrode 34 (the structure of a fixed electrode plate 19) opposite to the diaphragm. However, these drawings do not reflect the MEMS manufacturing process of the acoustic sensor 11.

The acoustic sensor 11 is a capacitance type element which is manufactured by using MEMS technique. As shown in FIGS. 4 and 5, in the acoustic sensor 11, the diaphragm 13 is provided over the upper face of the silicon substrate 12 (substrate) via anchors 16a and 16b, and a canopy section 14 is disposed through a very small air gap 20 over the diaphragm 13 and is fixed to the upper face of the silicon substrate 12.

The silicon substrate 12 is made of a single crystal silicon. A chamber 15 (hollow portion) is opened in the silicon substrate 12 so as to be extended from the front face thereof to the back face thereof. The wall faces of the chamber 15 are inclined surfaces formed of (111) planes of a (100) plane silicon substrate or planes equivalent to the (111) planes, but may be vertical surfaces.

The diaphragm 13 is arranged over the silicon substrate 12 so as to cover the upper side of the chamber 15. As shown in FIGS. 4 and 7, the diaphragm 13 is formed in a substantially rectangular shape. The diaphragm 13 is formed of a thin polysilicon film having conductivity, and is a vibration electrode plate by itself. The diaphragm 13 is separated into two large and small regions by a substantially straight slit 17 extended in the direction parallel to the short sides thereof. However, the diaphragm 13 is not completely separated into two by the slit 17, and the two separated regions thereof are mechanically and electrically connected near the ends of the slit 17. In the following, of the two regions separated by the slit 17, the substantially rectangular region having a larger area is called a first diaphragm 13a, and the substantially rectangular region having a smaller area than the first diaphragm 13a is called a second diaphragm 13b.

Beams 26 provided at the corner portions of the first diaphragm 13a are supported via the anchors 16a over the upper face of the silicon substrate 12. The first diaphragm 13a is supported so as to be lifted from the upper face of the silicon substrate 12. Between the adjacent anchors 16a, a narrow vent hole 22a is formed between the lower face of the outer periphery of the first diaphragm 13a and the upper face of the silicon substrate 12. The vent hole 22a passes acoustic vibration therethrough.

Both short sides of the second diaphragm 13b are supported via the anchors 16b over the upper face of the silicon substrate 12. The second diaphragm 13b is supported so as to be lifted from the upper face of the silicon substrate 12. A narrow vent hole 22b is formed between the lower faces of the long sides of the second diaphragm 13b and the upper face of the silicon substrate 12. The vent hole 22b passes acoustic vibration therethrough.

The first diaphragm 13a and the second diaphragm 13b are of the same height from the upper face of the silicon substrate 12. That is, the vent holes 22a and 22b are gaps having an equal height. In addition, an extraction wiring 27 is provided on the upper face of the silicon substrate 12, and is connected to the diaphragm 13. The anchors 16a and 16b are formed of $SiO_2$.

As shown in FIG. 5, the canopy section 14 is provided with the fixed electrode plate 19 made of polysilicon, on the lower face of an SiN back plate 18. The canopy section 14 is formed in a dome shape, and has on its lower side a hollow portion covering the diaphragm 13. The very small air gap 20 is formed between the lower face of the canopy section 14 (that is, the lower face of the fixed electrode plate 19) and the upper face of the diaphragm 13.

As shown in FIG. 8, the fixed electrode plate 19 is separated into the first fixed electrode plate 19a opposite to the first diaphragm 13a and the second fixed electrode plate 19b opposite to the second diaphragm 13b. The first fixed electrode plate 19a and the second fixed electrode plate 19b are electrically separated from each other. The first fixed electrode plate 19a has a larger area than the second fixed electrode plate 19b. An extraction wiring 28 is extracted from the first fixed electrode plate 19a. An extraction wiring 29 is extracted from the second fixed electrode plate 19b. In addition, the conductive barrier electrode 34 is disposed on the lower face of the back plate 18 between the first fixed electrode plate 19a and the second fixed electrode plate 19b. The barrier electrode 34 passes from one end to the other end of the gap between the first fixed electrode plate 19a and the second fixed electrode plate 19b. A bias voltage is applied to the first fixed electrode plate 19a and the second fixed electrode plate 19b. The barrier electrode 34 is connected at a reference potential (e.g., a ground potential). Alternatively, the barrier electrode 34 may be held at the same potential as the first fixed electrode plate 19a and the second fixed electrode plate 19b.

A first acoustic sensing section 23a of a capacitor structure is formed of the first diaphragm 13a and the first fixed electrode plate 19a opposite to each other across the air gap 20. A second acoustic sensing section 23b of a capacitor structure is formed of the second diaphragm 13b and the second fixed electrode plate 19b opposite to each other across the air gap 20. The gap distance of the air gap 20 in the first acoustic sensing section 23a is equal to the gap distance of the air gap 20 in the second acoustic sensing section 23b. In the illustration, the separating position of the first diaphragm 13a and the second diaphragm 13b and the separating position of the first fixed electrode plate 19a and the second fixed electrode plate 19b coincide with each other, but they may be shifted from each other.

In the first acoustic sensing section 23a, a large number of acoustic perforations 24 are opened in the canopy section 14 (that is, the back plate 18 and the first fixed electrode plate 19a) so as to be extended from the upper face thereof to the lower face thereof. The acoustic perforations 24 pass acoustic vibration therethrough. In the second acoustic sensing section 23b, a large number of acoustic perforations 24 are opened in the canopy section 14 (that is, the back plate 18 and the second fixed electrode plate 19b) so as to be extended from the upper face thereof to the lower face thereof. The acoustic perforations 24 pass acoustic vibration therethrough. In the illustration, in the first acoustic sensing section 23a and the second acoustic sensing section 23b, the acoustic perforations 24 are equal in hole diameter and pitch, but can be different in hole diameter and pitch.

As shown in FIGS. 6 and 8, the acoustic perforations 24 are regularly arrayed in the first acoustic sensing section 23a and the second acoustic sensing section 23b. In the illustration, the acoustic perforations 24 are arrayed in a triangular shape along three directions forming an angle of 120°, but may be arranged in a rectangular or concentric shape.

As shown in FIG. 5, in the first acoustic sensing section 23a and the second acoustic sensing section 23b, very small stoppers 25 (projections) in a cylindrical shape are projected from the lower face of the canopy section 14. The stoppers 25 are integrally projected from the lower face of the back plate 18, and are extended through the first fixed electrode plate 19a and the second fixed electrode plate 19b so as to be projected from the lower face of the canopy section 14. The stoppers 25 are made of SiN like the back plate 18, and have insulating properties. The stoppers 25 prevent sticking of the first diaphragm 13a and the second diaphragm 13b to the first fixed electrode plate 19a and the second fixed electrode plate 19b by electrostatic force.

The other end of the extraction wiring 27 connected to the diaphragm 13 is connected to a shared electrode pad 31. The extraction wiring 28 extracted from the first fixed electrode plate 19a is connected to a first electrode pad 32a. The extraction wiring 29 extracted from the second fixed electrode plate 19b is connected to a second electrode pad 32b. In addition, an electrode pad 33 is connected to the silicon substrate 12, and is held at the ground potential. As shown in FIG. 6, the barrier electrode 34 is connected to the shared electrode pad 31 by an extraction wiring 30, and is held at the same reference potential as the diaphragm 13. Alternatively, the barrier electrode 34 may be connected to an electrode pad only for the barrier electrode 34, and be held independently at the reference potential (e.g., the ground potential) or at the same potential as the first fixed electrode plate 19a and the second fixed electrode plate 19b.

In the acoustic sensor 11, acoustic vibration which enters the chamber 15 (front chamber) vibrates the first diaphragm 13a and the second diaphragm 13b as thin films in the same phase. When the first diaphragm 13a and the second diaphragm 13b are vibrated, the electrostatic capacitances of the first acoustic sensing section 23a and the second acoustic sensing section 23b are changed. As a result, in the first acoustic sensing section 23a and the second acoustic sensing section 23b, the acoustic vibration (the change in sound pressure) sensed by the first diaphragm 13a and the second diaphragm 13b becomes the change in electrostatic capacitance between the first diaphragm 13a and the second diaphragm 13b and the first fixed electrode plate 19a and the second fixed electrode plate 19b, and is outputted as electric signals. In addition, in a different use form, that is, in a use form in which the chamber 15 is the back chamber, the acoustic vibration passes through acoustic perforations 24a and 24b to enter the air gap 20 in the canopy section 14, and vibrates the first diaphragm 13a and the second diaphragm 13b as thin films.

In addition, the area of the second diaphragm 13b is smaller than the area of the first diaphragm 13a. The second acoustic sensing section 23b is a low-sensitivity acoustic sensor for the sound pressure range from intermediate sound volume to high sound volume. The first acoustic sensing section 23a is a high-sensitivity acoustic sensor for the sound pressure range from low sound volume to intermediate sound volume. Therefore, the first acoustic sensing section 23a and the second acoustic sensing section 23b are hybridized to output signal by a later-described processing circuit, thereby widening the dynamic range of the acoustic sensor 11. For instance, the dynamic range of the first acoustic sensing section 23a is approximately 30 dB to 120 dB, and the dynamic range of the second acoustic sensing section 23b is approximately 50 dB to 140 dB, so that the first acoustic sensing section 23a is combined with the second acoustic sensing section 23b to widen the dynamic range to approximately 30 dB to 140 dB. In addition, the acoustic sensor 11 is separated into the first acoustic sensing section 23a ranging from low sound volume to intermediate sound volume and the second acoustic sensing section 23b ranging from intermediate sound volume to high sound volume. The output of the first acoustic sensing section 23a cannot be used at high sound volume, so that increase in the harmonic distortion in the first acoustic sensing section 23a in the high sound pressure range cannot be inconvenient. Therefore, the sensitivity of the first acoustic sensing section 23a with respect to low sound volume can be higher.

Further, in the acoustic sensor 11, the first acoustic sensing section 23a and the second acoustic sensing section 23b are formed over the same substrate. The first acoustic sensing section 23a and the second acoustic sensing section 23b have the first diaphragm 13a and the second diaphragm 13b obtained by separating the diaphragm 13, and the first fixed electrode plate 19a and the second fixed electrode plate 19b obtained by separating the fixed electrode plate 19, respectively. That is, one sensing section in itself is separated into two to hybridize the first acoustic sensing section 23a and the second acoustic sensing section 23b. As compared with the prior art in which two independent sensing sections are provided over one substrate and over different substrates, the first acoustic sensing section 23a and the second acoustic sensing section 23b are similar in the detection sensitivity variation. As a result, the detection sensitivity variation between the first acoustic sensing section 23a and the second acoustic sensing section 23b can be lesser. In addition, since the first acoustic sensing section 23a and the second acoustic sensing section 23b share the diaphragm and the fixed electrode plate, mismatch of the frequency characteristic and the acoustic characteristic, such as phase, can be reduced.

Figure 9:
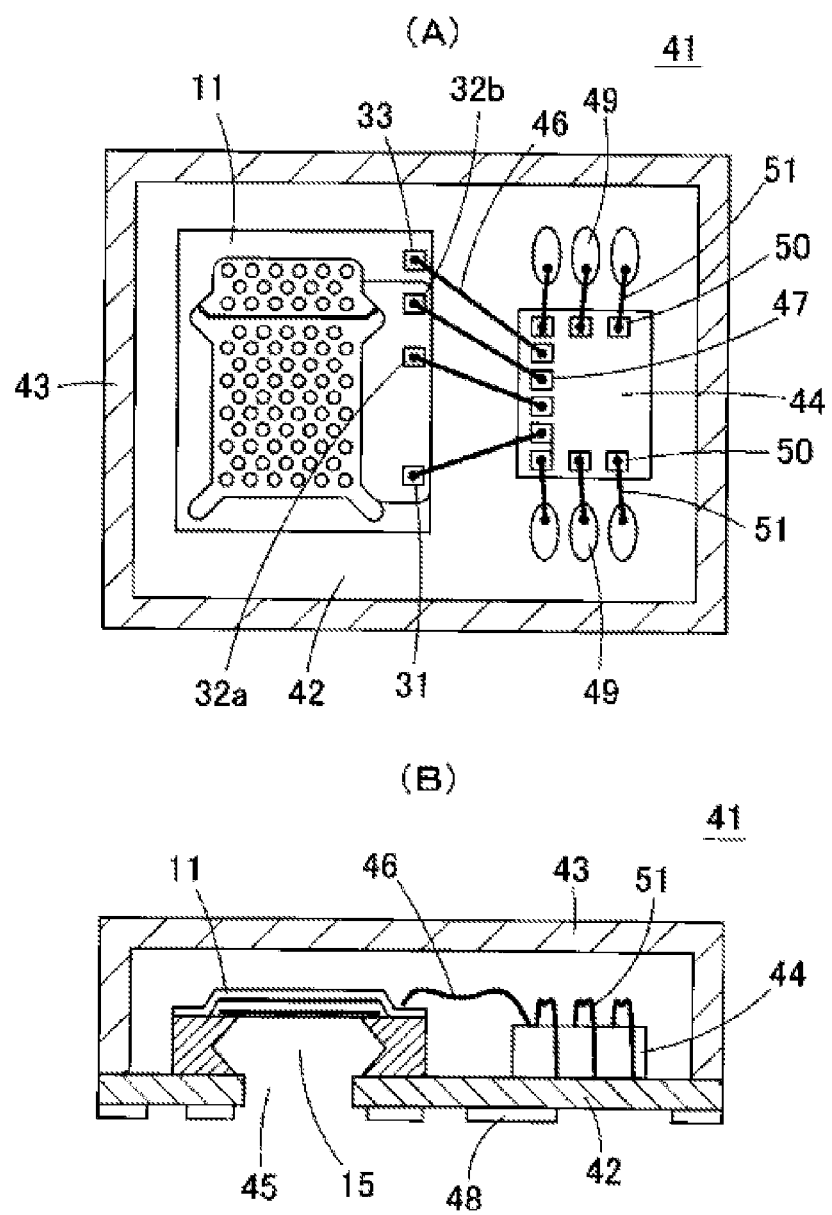
FIG. 9A is a partially broken plan view of a microphone in which the acoustic sensor according to the first embodiment of the present invention and a signal processing circuit are accommodated in a casing.
FIG. 9B is a longitudinal sectional view of the microphone.

FIG. 9A is a partially broken plan view of a microphone 41 incorporating the acoustic sensor 11 of the first embodiment, and shows the inside thereof by removing the upper face of a cover 43. FIG. 9B is a longitudinal sectional view of the microphone 41.

The microphone 41 incorporates the acoustic sensor 11 and a signal processing circuit 44 (ASIC) in a package having a circuit substrate 42 and the cover 43. The acoustic sensor 11 and the signal processing circuit 44 are mounted on the upper face of the circuit substrate 42. A sound introduction hole 45 is opened in the circuit substrate 42, and introduces acoustic vibration into the acoustic sensor 11. The acoustic sensor 11 is mounted on the upper face of the circuit substrate 42 so as to align the opening in the lower face of the chamber 15 with the sound introduction hole 45, thereby covering the sound introduction hole 45. Therefore, the chamber 15 of the acoustic sensor 11 is the front chamber, and the space in the package is the back chamber.

The shared electrode pad 31, the first electrode pad 32a, the second electrode pad 32b, and the electrode pad 33 of the acoustic sensor 11 are connected to pads 47 of the signal processing circuit 44 by bonding wires 46. A plurality of terminals 48 are provided on the lower face of the circuit substrate 42, and electrically connect the microphone 41 to the outside. Electrodes 49 conducting with the terminals 48 are provided on the upper face of the circuit substrate 42. Pads 50 of the signal processing circuit 44 mounted on the circuit substrate 42 are connected to the electrodes 49 by bonding wires 51. The pads 50 of the signal processing circuit 44 perform power supply to the acoustic sensor 11, and output the capacitance change signal of the acoustic sensor 11 to the outside.

The cover 43 is mounted on the upper face of the circuit substrate 42 so as to cover the acoustic sensor 11 and the signal processing circuit 44. The package has the function of an electromagnetic shield, and protects the acoustic sensor 11 and the signal processing circuit 44 from electric disturbance and mechanical shock from the outside.

The acoustic sensor 11 detects acoustic vibration which enters from the sound introduction hole 45 into the chamber 15. The signal processing circuit 44 signal processes, that is, amplifies the acoustic vibration for output. In the microphone 41, since the space in the package is the back chamber, the volume of the back chamber can be larger and the sensitivity of the microphone 41 can be higher.

In the microphone 41, the sound introduction hole 45 which introduces acoustic vibration into the package may be opened in the upper face of the cover 43. In this case, the chamber 15 of the acoustic sensor 11 is the back chamber, and the space in the package is the front chamber.

Figure 10:
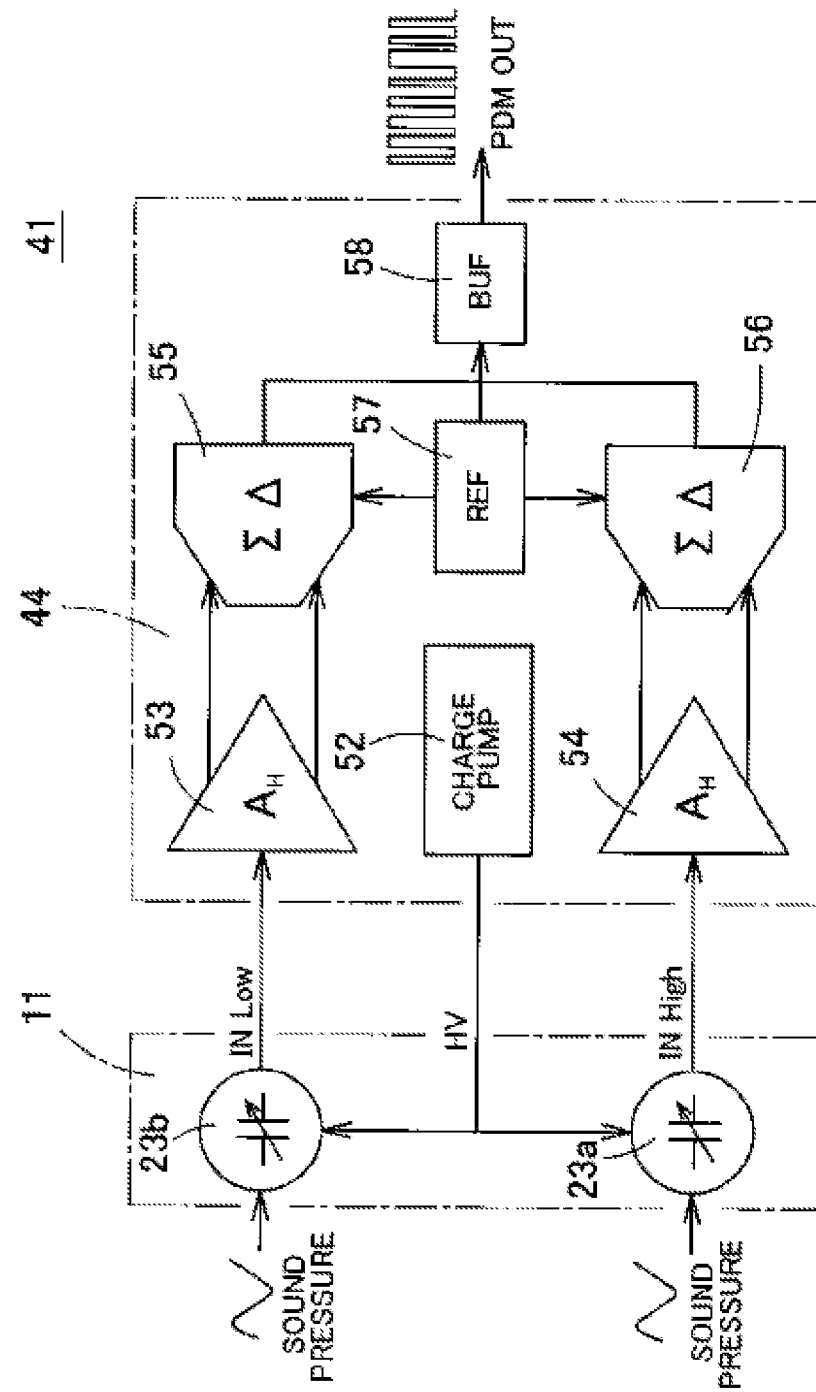
FIG. 10 is a circuit diagram of the microphone according to the first embodiment of the present invention.

FIG. 10 is a circuit diagram of the MEMS microphone 41 shown in FIG. 9A. As shown in FIG. 10, the acoustic sensor 11 has the first acoustic sensing section 23a on the high sensitivity side and the second acoustic sensing section 23b on the low sensitivity side in which the capacitance changes according to acoustic vibration.

In addition, the signal processing circuit 44 has a charge pump 52, a low-sensitivity amplifier 53, a high-sensitivity amplifier 54, ΣΔ (ΔΣ) type ADCs (Analog-to-Digital Converters) 55 and 56, a reference voltage generator 57, and a buffer 58.

The charge pump 52 applies high voltage HV to the first acoustic sensing section 23a and the second acoustic sensing section 23b. The low-sensitivity amplifier 53 amplifies an electric signal outputted from the second acoustic sensing section 23b. The high-sensitivity amplifier 54 amplifies an electric signal outputted from the first acoustic sensing section 23a. The ΣΔ type ADC 55 converts the signal amplified by the low-sensitivity amplifier 53 to a digital signal. Likewise, the ΣΔ type ADC 56 converts the signal amplified by the high-sensitivity amplifier 54 to a digital signal. The digital signals converted by the ΣΔ type ADCs 55 and 56 are outputted to the outside on one data line as a PDM (pulse density modulation) signal via the buffer 58. Although not shown, by selecting any one of the digital signals mixed on one data line according to signal intensity, the outputs of the first acoustic sensing section 23a and the second acoustic sensing section 23b can be switched according to sound pressure.

In the example of FIG. 10, the two digital signals converted by the ΣΔ type ADCs 55 and 56 are mixed to be outputted to one data line, but may be outputted to separated data lines.

In the acoustic sensor provided with the first acoustic sensing section on the high sensitivity side and the second acoustic sensing section on the low sensitivity side or the microphone incorporating the acoustic sensor, the harmonic distortion of the acoustic sensor on the low sensitivity side can be increased due to electric interference between the first acoustic sensing section on the high sensitivity side (low sound volume side) and the second acoustic sensor on the low sensitivity side (high sound volume side), and the sensitivity can be changed. The acoustic sensor 11 according to the first embodiment of the present invention can prevent harmonic distortion increase and sensitivity change. This reason is as follows.

Figure 11:
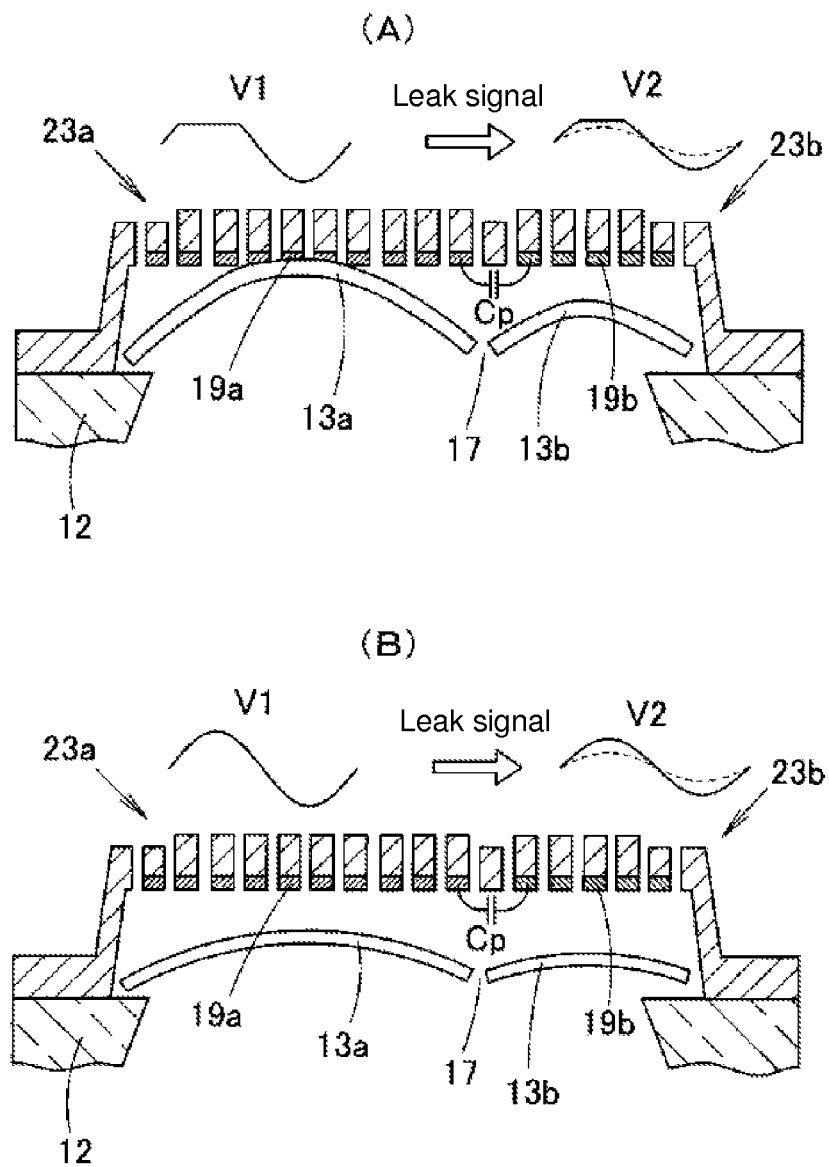
FIG. 11A is a schematic sectional view showing a state where the diaphragm on the high sensitivity side collides with a back plate in an acoustic sensor of a comparative example.
FIG. 11B is a schematic sectional view showing a state where the signal of an acoustic sensing section on the high sensitivity side leaks into an acoustic sensing section on the low sensitivity side to change the sensitivity of the acoustic sensing section on the low sensitivity side in the acoustic sensor of the comparative example.

The first diaphragm 13a on the high sensitivity side has a larger area than the second diaphragm 13b on the low sensitivity side, and is flexible. Therefore, when acoustic vibration having a high sound pressure is added to the acoustic sensor, the first diaphragm 13a can collide with the back plate 18. FIG. 11A shows an acoustic sensor of a comparative example in which the first diaphragm 13a collides with the back plate 18 due to high sound pressure.

In the comparative example shown here, the barrier electrode 34 is not provided on the back plate 18.

As shown in FIG. 11A, the first diaphragm 13a which collides with the back plate 18 distorts vibration of the first diaphragm 13a due to the impact. A distorted output signal as shown in FIG. 11A is generated in the first acoustic sensing section 23a. On the other hand, the second diaphragm 13b which has a lesser displacement than the first diaphragm 13a does not collide with the back plate 18, and provides sine wave vibration indicated by the dashed line in FIG. 11A. However, the distorted output signal generated in the first acoustic sensing section 23a is transmitted to the second acoustic sensing section 23b, so that collision of the first diaphragm 13a also distorts the output signal of the second acoustic sensing section 23b. As a result, as indicated by the solid line in FIG. 11A, the output signal from the second acoustic sensing section 23b is distorted. Consequently, the total harmonic distortion of the second acoustic sensing section 23b is deteriorated, so that the maximum detection sound pressure of the acoustic sensor can be lowered to narrow the dynamic range.

The first fixed electrode plate 19a on the high sensitivity side and the second fixed electrode plate 19b on the low sensitivity side are separated in structure. However, since the distance between the first fixed electrode plate 19a and the second fixed electrode plate 19b is short, parasitic capacitance Cp is caused between the first fixed electrode plate 19a and the second fixed electrode plate 19b. As shown in FIG. 11B, in the comparative example in which the barrier electrode 34 is not provided, the output signal of the first acoustic sensing section 23a on the high sensitivity side is likely to leak into the second acoustic sensing section 23b on the low sensitivity side via parasitic capacitance Cp between the first fixed electrode plate 19a and the second fixed electrode plate 19b. When part of the signal generated in the first acoustic sensing section 23a on the high sensitivity side leaks into the second acoustic sensing section 23b, the leak signal is overlapped with the signal generated in the second acoustic sensing section 23b on the low sensitivity side. Consequently, the signal outputted from the second acoustic sensing section 23b is greater than the original signal indicated by the dashed line in FIG. 11B. As a result, the sensitivity of the signal outputted from the second acoustic sensing section 23b is different from the design value.

On the contrary, in the acoustic sensor 11 of the first embodiment, as shown in FIG. 8, the barrier electrode 34 is arranged along substantially the entire length of the gap between the first fixed electrode plate 19a and the second fixed electrode plate 19b (the gap as a leak path), and is connected at the reference potential, such as the ground potential. Therefore, a leak signal from the first fixed electrode plate 19a on the high sensitivity side can be released to the reference potential through the barrier electrode 34. Distortion of the output signal of the second acoustic sensing section 23b on the low sensitivity side to deteriorate the total harmonic distortion due to the distorted leak signal from the first acoustic sensing section 23a on the high sensitivity side can thus be prevented. Sensitivity change in the second acoustic sensing section 23b on the low sensitivity side due to the leak signal from the first acoustic sensing section 23a on the high sensitivity side can be prevented.

Figure 12:
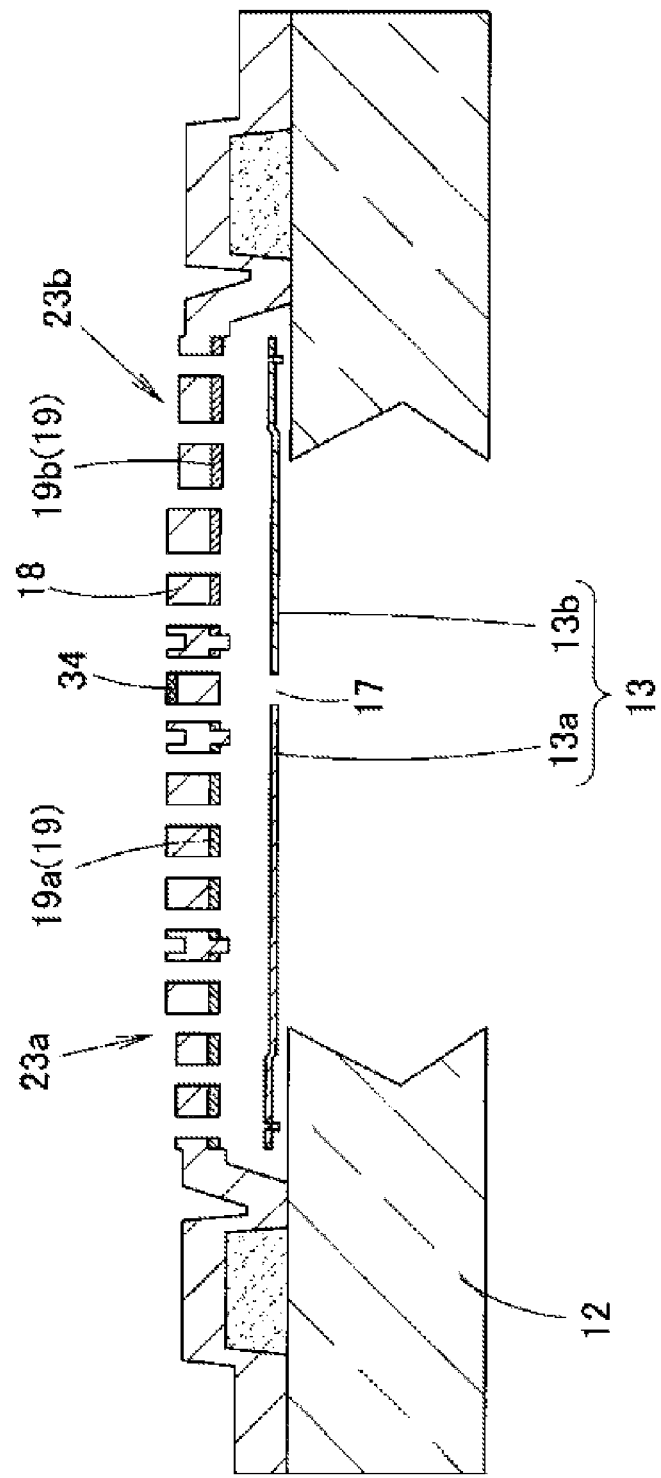
FIG. 12 is a cross-sectional view of the acoustic sensor in which a barrier electrode is provided on the upper face of the back plate.

The barrier electrode 34 can also be provided in a plane different from the first fixed electrode plate 19a and the second fixed electrode plate 19b. That is, when the first fixed electrode plate 19a and the second fixed electrode plate 19b are provided on the lower face of the back plate 18, as shown in FIG. 12, the barrier electrode 34 can also be provided on the upper face of the back plate 18. However, a signal leaks from the first fixed electrode plate 19a into the second fixed electrode plate 19b, so that a leak path is provided between the end of the first fixed electrode plate 19a and the end of the second fixed electrode plate 19b. As shown in FIG. 12, when the barrier electrode 34 is arranged in a plane different from the first fixed electrode plates 19a and 19b, the leak path between the first fixed electrode plate 19a and the second fixed electrode plate 19b is not completely eliminated. The barrier electrode 34 is arranged in the same plane as the first fixed electrode plate 19a and the second fixed electrode plate 19b, according to one or more embodiments of the present invention. As illustrated in the first embodiment, when the first fixed electrode plate 19a and the second fixed electrode plate 19b are provided on the lower face of the back plate 18, the barrier electrode 34 is desirably provided on the lower face of the back plate 18.

When the barrier electrode 34 is arranged in the same plane as the first fixed electrode plate 19a and the second fixed electrode plate 19b, in the process manufacturing the first fixed electrode plate 19a and the second fixed electrode plate 19b, the barrier electrode 34 can be manufactured with the same material as the first fixed electrode plate 19a and the second fixed electrode plate 19b at the same time. Since no additional processes for manufacturing the barrier electrode 34 are necessary, the productivity of the acoustic sensor 11 can be improved.

Even when length L2 of the barrier electrode 34 is shorter than the width of the fixed electrode plate 19, the leak signal can be partially interrupted. However, to sufficiently interrupt the leak signal, as shown in FIG. 8, length L2 of the barrier electrode 34 is required to be longer than width L1 of the first fixed electrode plate 19a and the second fixed electrode plate 19b. For instance, in the acoustic sensor 11 having a length of 1.6 mm, a width of 1.35 mm, and a thickness of 0.4 mm, width L1 of the first fixed electrode plate 19a and the second fixed electrode plate 19b is approximately 700 μm. Thus, length L2 of the barrier electrode 34 is desirably 700 μm or more.

As shown in FIG. 8, the end of the barrier electrode 34 is formed in an arc shape without being angular. When the end of the barrier electrode 34 is angular, a stress concentrates onto the angular portion and a crack is likely to be caused in the barrier electrode 34. Thus, the end of the barrier electrode 34 is desirably formed in an arc shape to prevent the crack.

Experimental results obtained for examining the effect by providing the barrier electrode 34 will be described.

Figure 13:
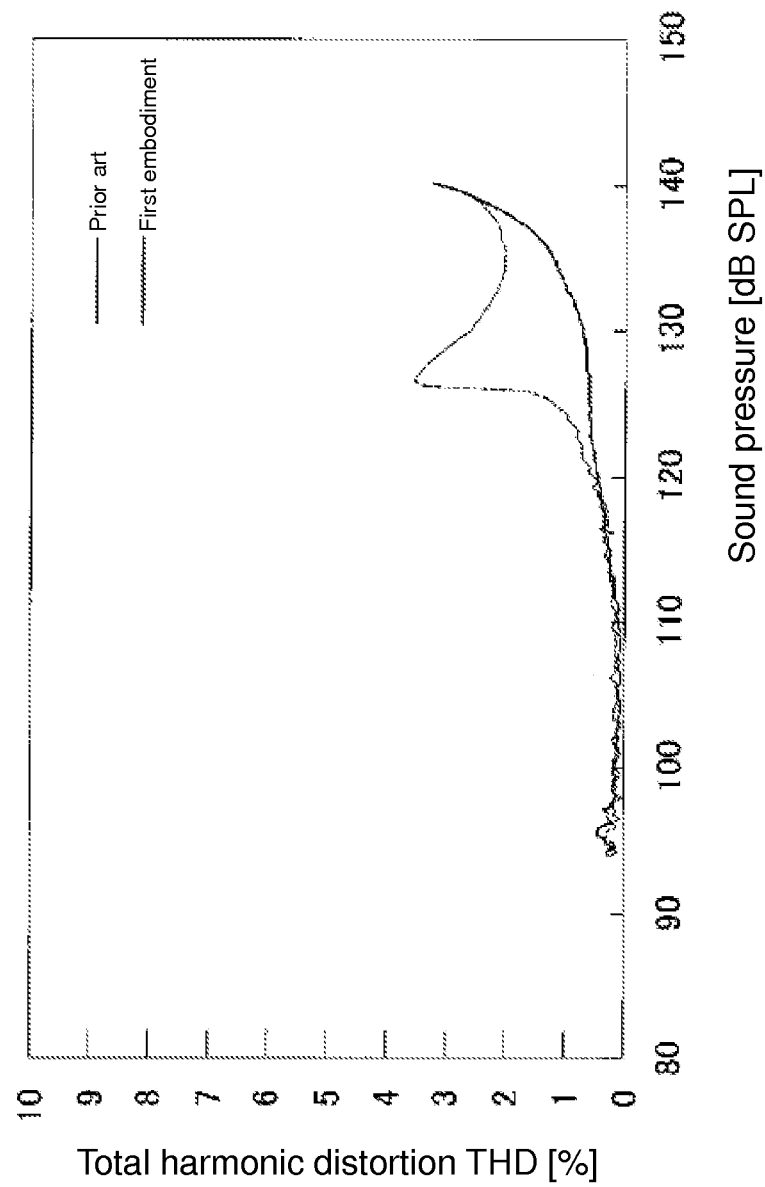
FIG. 13 is a graph showing the relation between the sound pressure and the total harmonic distortion of the acoustic sensing section on the low sensitivity side by comparing the acoustic sensor of the comparative example not having the barrier electrode with the acoustic sensor according to the first embodiment having the barrier electrode.

FIG. 13 shows an example of the results of the relation between the sound pressure and total harmonic distortion THD in the second acoustic sensing section 23b on the low sensitivity side, obtained by an experiment. In FIG. 13, the dashed line indicates the case of the acoustic sensor of the comparative example not having the barrier electrode 34, and the solid line indicates the case of the acoustic sensor 11 of the first embodiment having the barrier electrode 34. In FIG. 13, by providing the barrier electrode 34, the total harmonic distortion can be lower.

Figure 14:
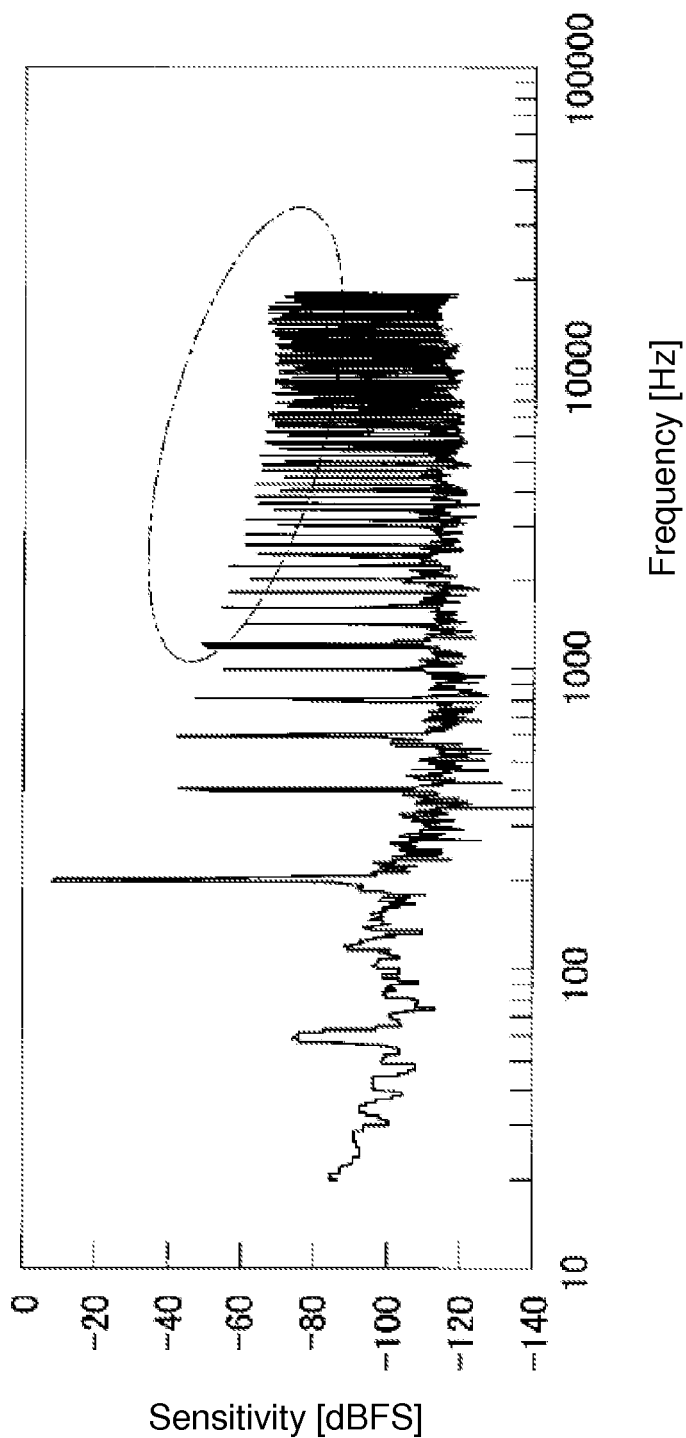
FIG. 14 is a graph showing the frequency characteristic of the sensitivity in an acoustic sensor of the prior art.
Figure 15:
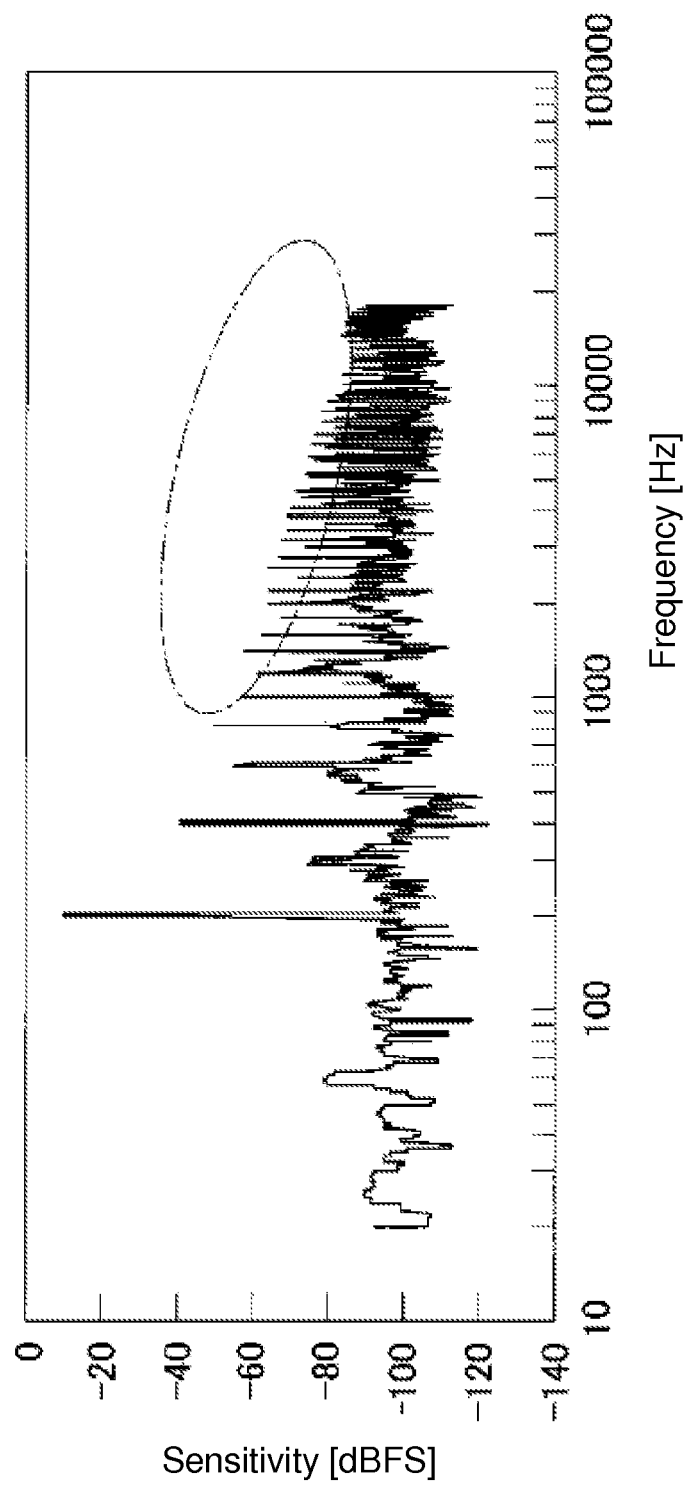
FIG. 15 is a graph showing the frequency characteristic of the sensitivity in the acoustic sensor according to the first embodiment of the present invention.

FIG. 14 shows the relation between the sensitivity and the frequency of the second acoustic sensing section 23b in the acoustic sensor of the comparative example not having the barrier electrode 34, obtained by an experiment. FIG. 15 shows the relation between the sensitivity and the frequency of the second acoustic sensing section 23b in the acoustic sensor of the first embodiment having the barrier electrode 34, obtained by an experiment. By comparing FIGS. 14 and 15, the sensitivity due to the harmonic distortion in the first embodiment of the present invention (FIG. 15) is lower than the sensitivity due to the harmonic distortion in the comparative example (FIG. 14). This is because by providing the barrier electrode 34, a distortion signal does not leak from the first fixed electrode plate 19a into the second fixed electrode plate 19b, thereby lowering the intensity of the distortion signal in the first embodiment.

Second Embodiment

Figure 16:
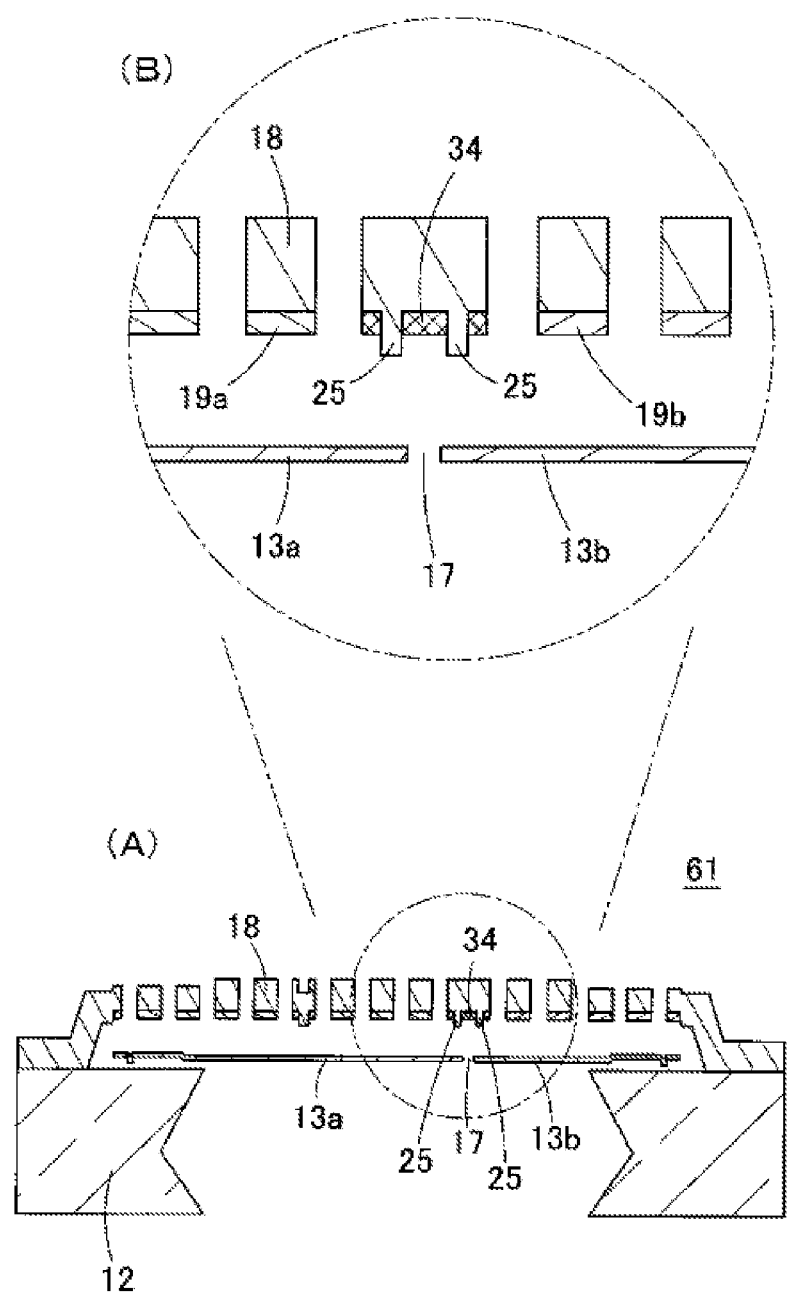
FIG. 16A is a cross-sectional view of an acoustic sensor according to a second embodiment of the present invention.
FIG. 16B is a diagram enlarging part of FIG. 16A.

FIG. 16A is a cross-sectional view of an acoustic sensor 61 according to a second embodiment of the present invention. In the acoustic sensor 61 of the second embodiment, the stoppers 25 are projected downward from the portion in which the barrier electrode 34 is provided or from the periphery thereof. The lower faces of the stoppers 25 are opposite to the regions of the first diaphragm 13a and the second diaphragm 13b along the slit 17. Except for this, the second embodiment is the same as the first embodiment, and the description is omitted (this is ditto for the following embodiments).

The barrier electrode 34 is arranged between the first fixed electrode plate 19a and the second fixed electrode plate 19b. Below the gap between the first fixed electrode plate 19a and the second fixed electrode plate 19b, the slit 17 is formed in the diaphragm 13. By forming the slit 17 in the diaphragm 13, the diaphragm 13 is separated into the first diaphragm 13a and the second diaphragm 13b. The first diaphragm 13a and the second diaphragm 13b are likely to be independently vibrated. The sensitivity difference between the first acoustic sensing section 23a and the second acoustic sensing section 23b can be greater. However, when the slit 17 is provided in the diaphragm 13, the shift amount of the edges of the slit 17 is increased. Consequently, the edges of the slit 17 are likely to be stuck to the barrier electrode 34, the first fixed electrode plate 19a, and the second fixed electrode plate 19b.

In the acoustic sensor 61 of the second embodiment, the stoppers 25 are provided in the portion in which the barrier electrode 34 is provided or in the periphery thereof. When the first diaphragm 13a and the second diaphragm 13b are greatly warped, the edges of the slit 17 are abutted onto the stoppers 25. Therefore, the edges of the slit 17 can be prevented from being stuck to the barrier electrode 34, the first fixed electrode plate 19a, and the second fixed electrode plate 19b.

Third Embodiment

In the first embodiment, the barrier electrode 34 is only provided along the gap between the first fixed electrode plate 19a and the second fixed electrode plate 19b. However, the barrier electrode 34 may be provided so as to surround the first fixed electrode plate 19a and the second fixed electrode plate 19b.

Figure 17:
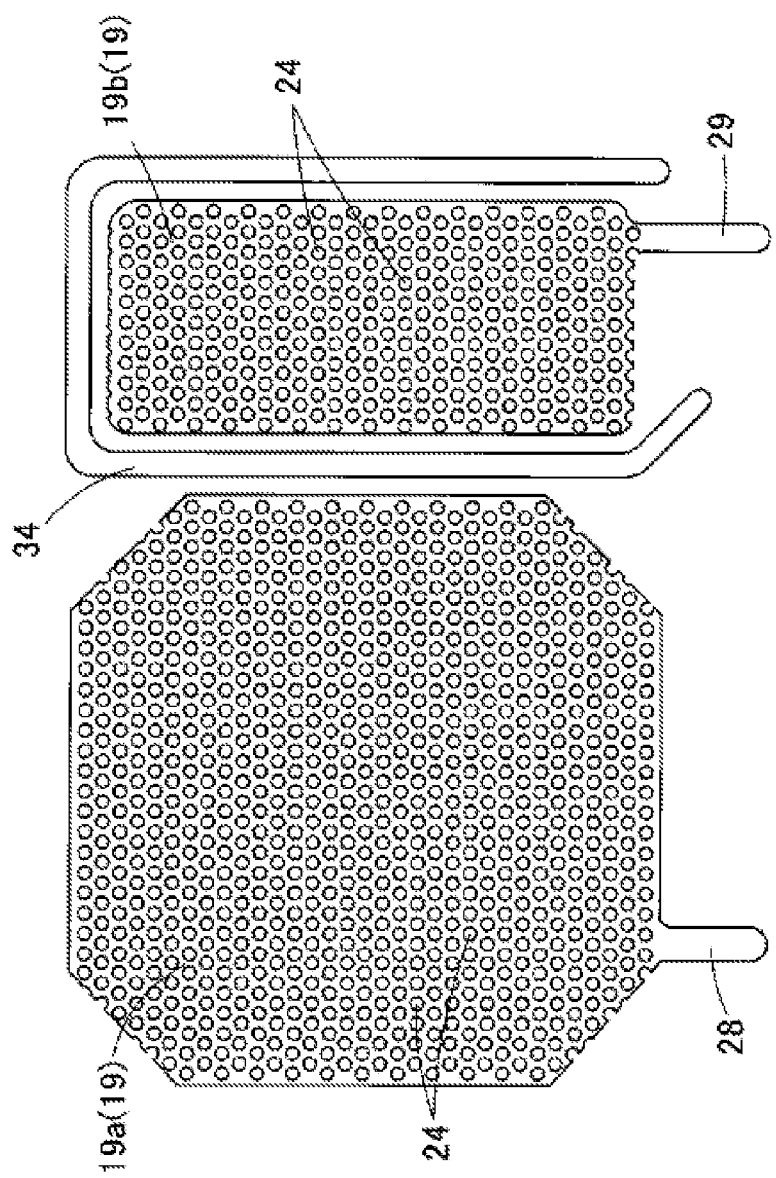
FIG. 17 is a plan view showing the structures of the barrier electrode and the fixed electrode plate according to a third embodiment of the present invention.

FIG. 17 is a plan view showing the structures of the barrier electrode and the fixed electrode plate according to a third embodiment of the present invention. In the third embodiment, the barrier electrode 34 is formed so as to surround the second fixed electrode plate 19b. Although not shown, the barrier electrode 34 may be formed so as to surround the first fixed electrode plate 19a.

Figure 18:
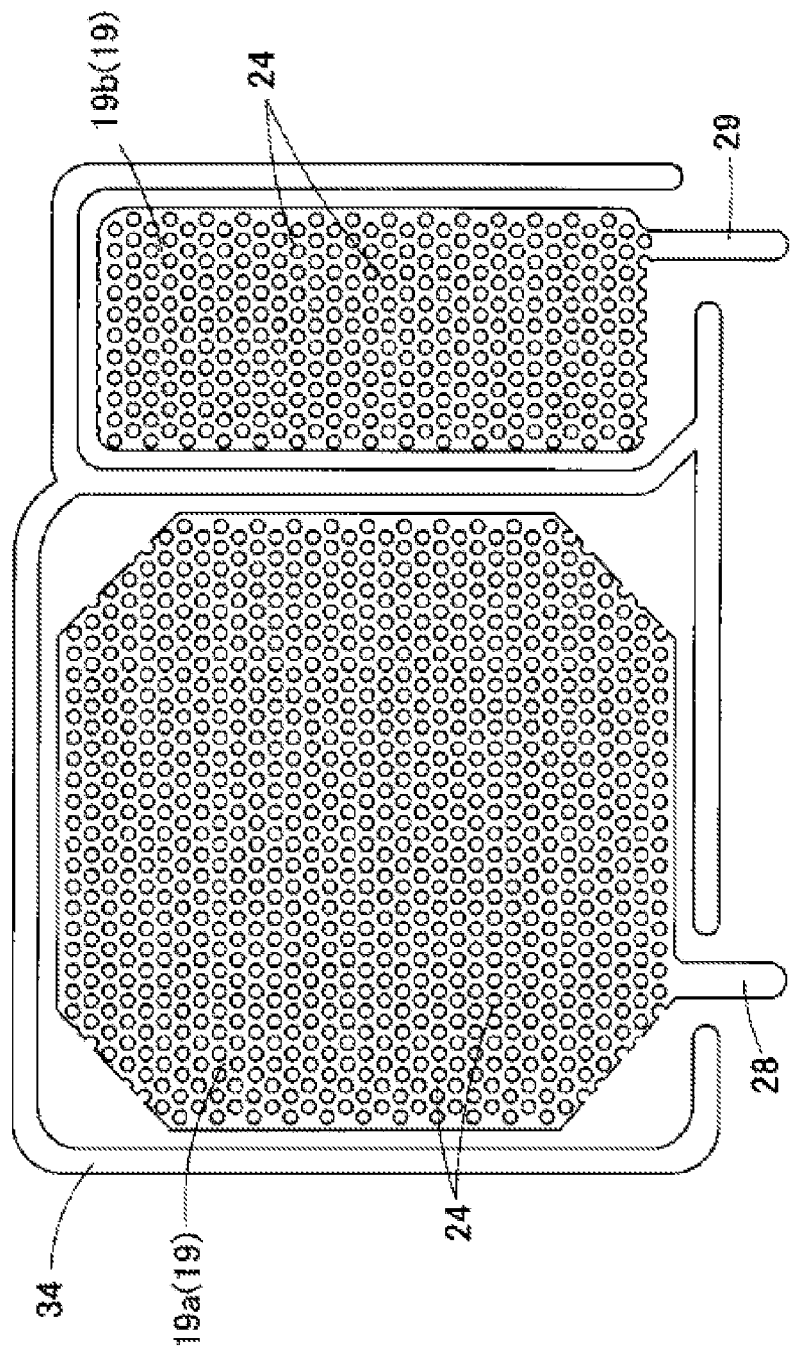
FIG. 18 is a plan view showing another example of the structures of the barrier electrode and the fixed electrode plate according to the third embodiment of the present invention.

As shown in FIG. 18, the barrier electrode 34 may be formed so as to surround the first fixed electrode plate 19a and the second fixed electrode plate 19b.

As shown in FIGS. 17 and 18, the barrier electrode 34 is formed so as to surround the first fixed electrode plate 19a and the second fixed electrode plate 19b. A leak signal can be interrupted more reliably between the first fixed electrode plate 19a and the second fixed electrode plate 19b.

Fourth Embodiment

Figure 19:
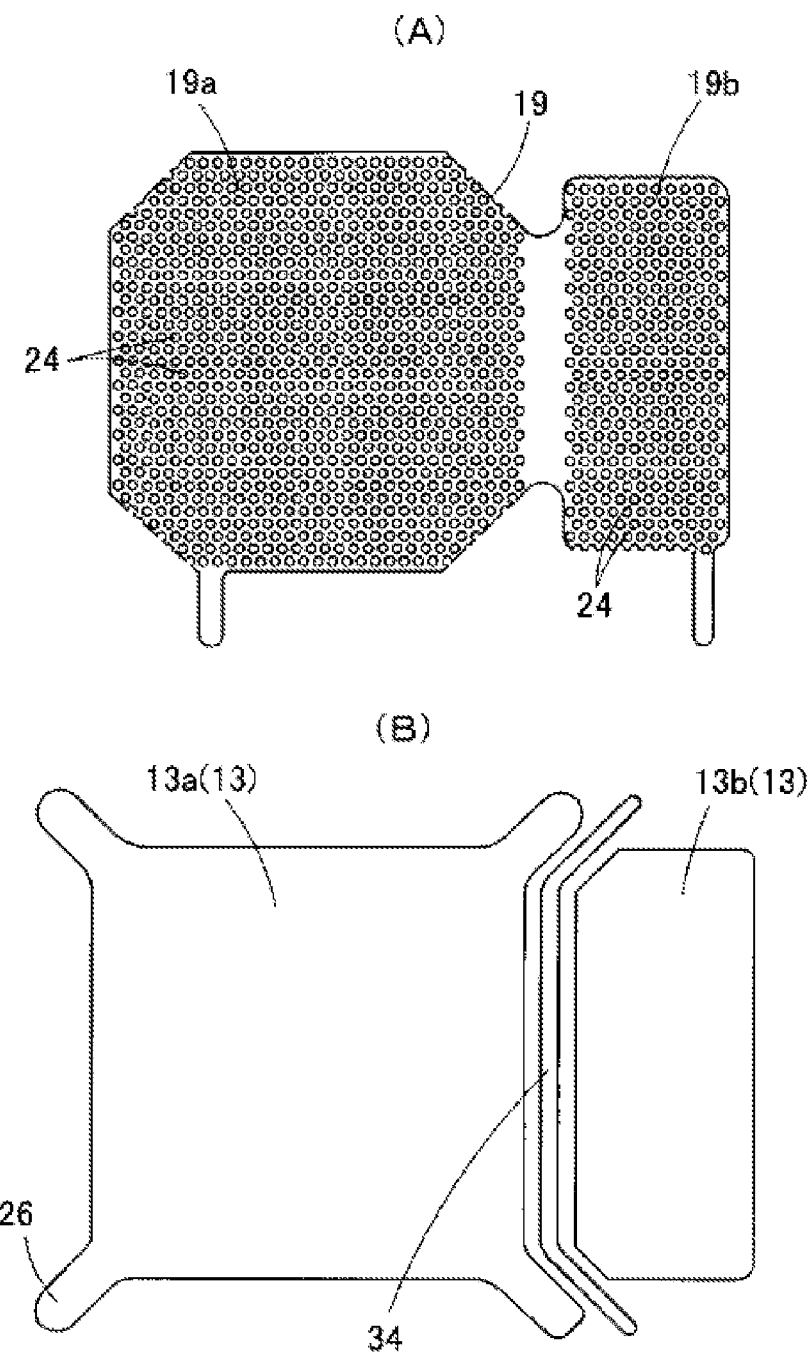
FIG. 19A is a plan view showing the fixed electrode plate according to a fourth embodiment of the present invention.
FIG. 19B is a plan view showing the structures of the diaphragm and the barrier electrode.

FIG. 19A is a plan view showing the fixed electrode plate according to a fourth embodiment of the present invention. FIG. 19B is a plan view showing the structures of the diaphragm and the barrier electrode according to the fourth embodiment of the present invention. As shown in FIG. 19A, in the acoustic sensor of the fourth embodiment, the first fixed electrode plate 19a and the second fixed electrode plate 19b are continuous and are integrally formed. On the other hand, the first diaphragm 13a and the second diaphragm 13b are separated from each other. When the first diaphragm 13a and the second diaphragm 13b are separated from each other, the barrier electrode 34 is provided between the first diaphragm 13a and the second diaphragm 13b.

Also in this case, the length of the barrier electrode 34 is desirably longer than the width of the first diaphragm 13a and the second diaphragm 13b. In addition, the ends of the barrier electrode 34 are desirably formed in an arc shape. Further, the barrier electrode 34 may be formed so as to surround the first diaphragm 13a and the second diaphragm 13b.

When the acoustic sensor has such a diaphragm structure, a leak signal can be transmitted from the first diaphragm 13a to the second diaphragm 13b. However, the barrier electrode 34 between the first diaphragm 13a and the second diaphragm 13b can receive the leak signal and release it to the ground. The influence of the leak signal in the second acoustic sensing section 23b can thus be eliminated.

Figure 20:
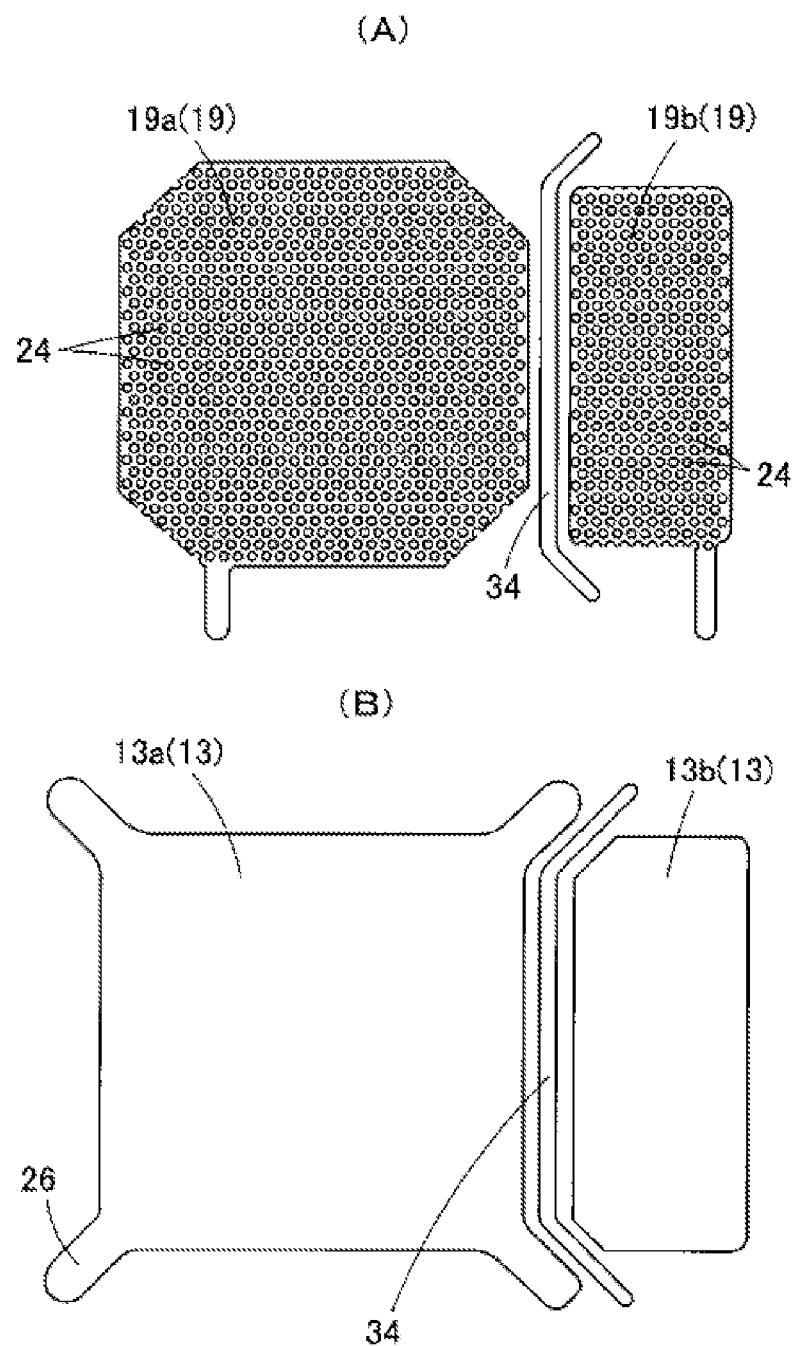
FIG. 20A is a plan view showing the fixed electrode plate and the barrier electrode according to a modification of the fourth embodiment of the present invention.
FIG. 20B is a plan view showing the structures of the diaphragm and the barrier electrode.

In FIGS. 20A and 20B, the diaphragm 13 is separated into the first diaphragm 13a and the second diaphragm 13b, and the fixed electrode plate 19 is separated into the first fixed electrode plate 19a and the second fixed electrode plate 19b. In this case, the barrier electrode 34 should be provided between the first diaphragm 13a and the second diaphragm 13b, and the barrier electrode 34 should be provided between the first fixed electrode plate 19a and the second fixed electrode plate 19b.

Figure 21:
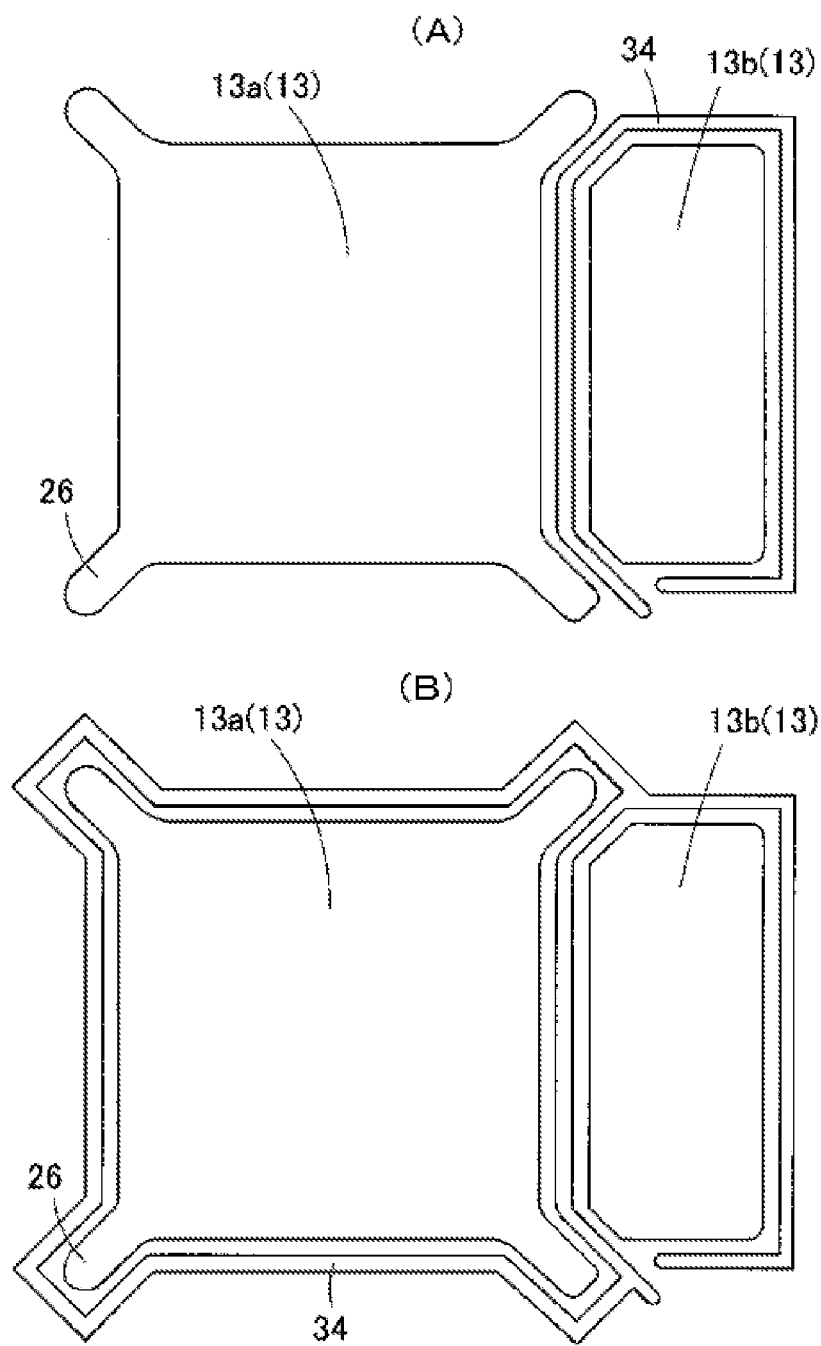
FIG. 21A is a plan view showing the structures of the diaphragm and the barrier electrode of another modification of the fourth embodiment of the present invention.
FIG. 21B is a plan view showing the structures of the diaphragm and the barrier electrode of a further modification of the fourth embodiment of the present invention.

FIG. 21A is a plan view showing the structures of the diaphragm and the barrier electrode of another modification of the fourth embodiment of the present invention. In this modification, the barrier electrode 34 is provided so as to pass through between the first diaphragm 13a and the second diaphragm 13b and to surround the second diaphragm 13b.

FIG. 21B is a plan view showing the structures of the diaphragm and the barrier electrode of a further modification of the fourth embodiment of the present invention. In this modification, the barrier electrode 34 is provided so as to pass through between the first diaphragm 13a and the second diaphragm 13b and to surround the first diaphragm 13a and the second diaphragm 13b.

In the modifications of FIGS. 21A and 21B, a leak signal can be interrupted more reliably between the first diaphragm 13a and the second diaphragm 13b.

Fifth Embodiment

Figure 22:
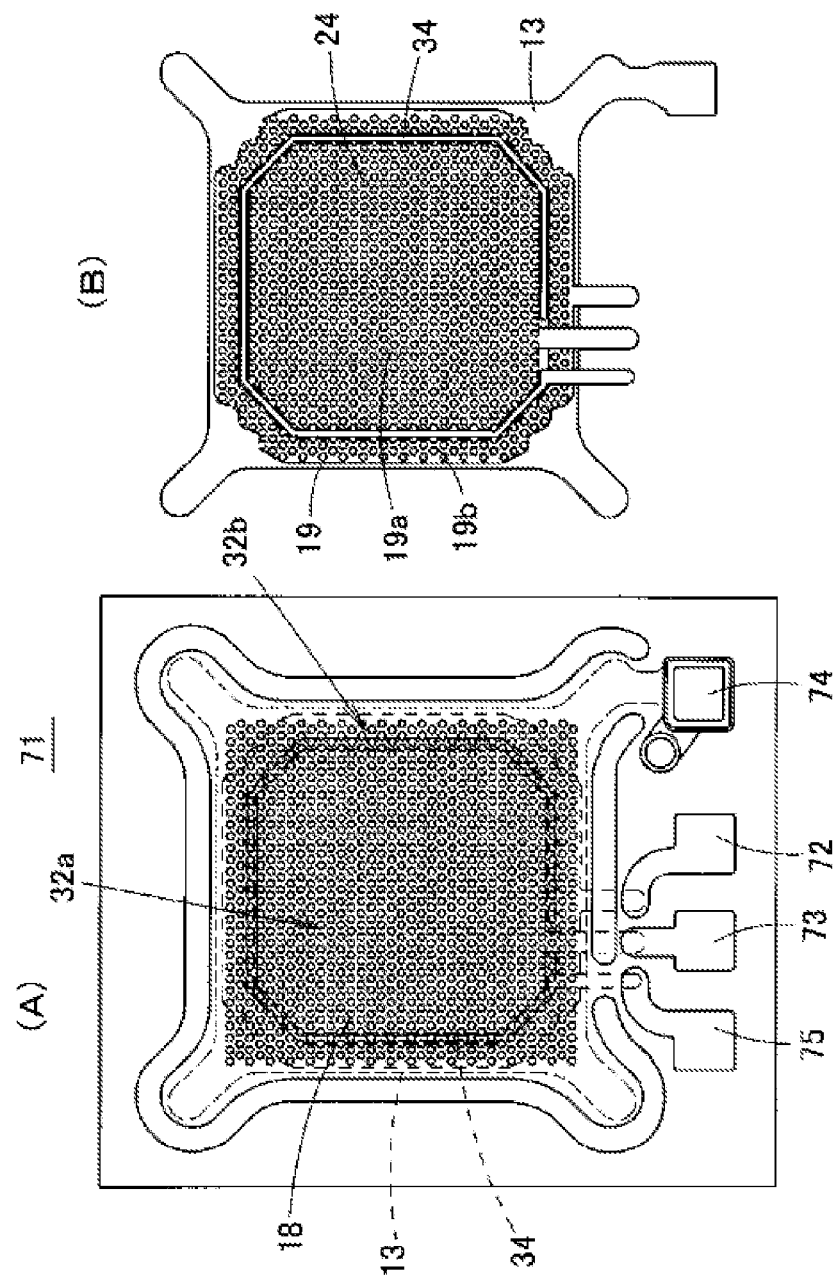
FIG. 22A is a plan view of an acoustic sensor according to a fifth embodiment of the present invention.
FIG. 22B is a plan view showing the fixed electrode plate, the diaphragm, and the barrier electrode of the acoustic sensor according to the fifth embodiment.
Figure 23:
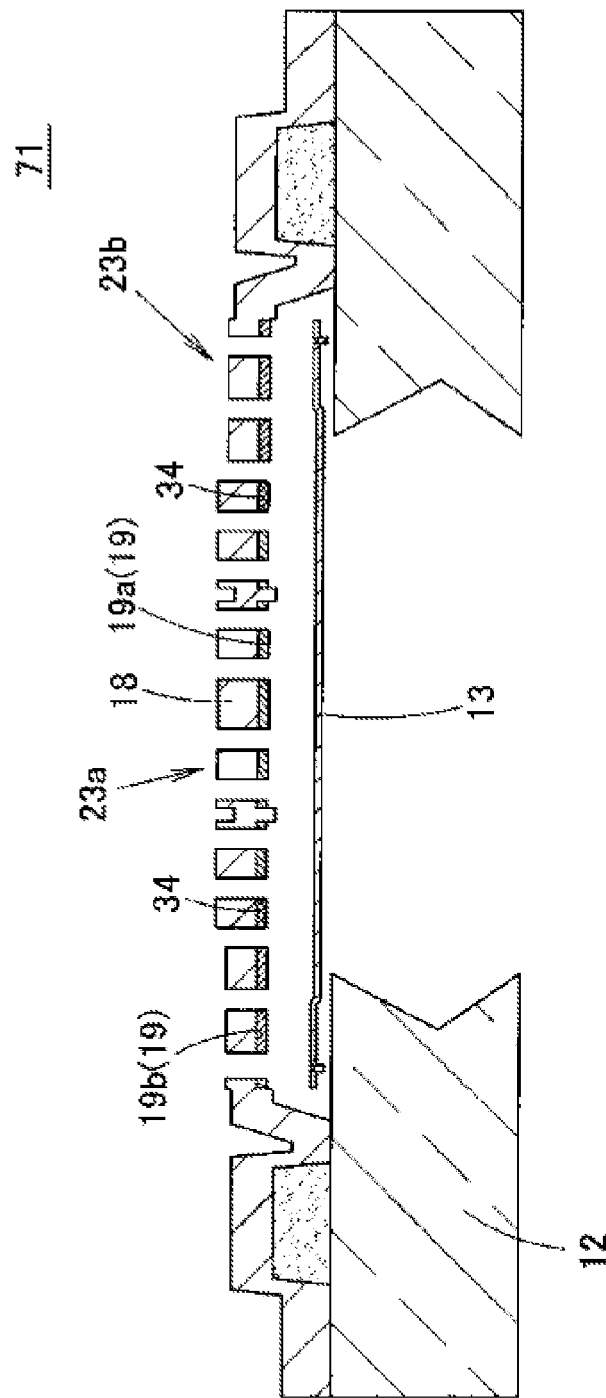
FIG. 23 is a cross-sectional view of the acoustic sensor shown in FIG. 22A.

FIG. 22A is a plan view of an acoustic sensor 71 according to a fifth embodiment of the present invention. FIG. 22B is a plan view showing the first fixed electrode plate 19a, the second fixed electrode plate 19b, the diaphragm 13, and the barrier electrode 34 of the acoustic sensor 71. FIG. 23 is a cross-sectional view of the acoustic sensor 71 of the fifth embodiment.

In the acoustic sensor 71 of the fifth embodiment, the diaphragm 13 in a substantially rectangular shape is used. The integrally formed diaphragm 13 does not have the slit 17 of the first embodiment. As shown in FIG. 22B, the fixed electrode plate 19 provided on the lower face of the back plate 18 is completely separated into the second fixed electrode plate 19b in the outer periphery thereof and the first fixed electrode plate 19a on the inner side thereof. The diaphragm 13 and the first fixed electrode plate 19a form the first acoustic sensing section 23a. The diaphragm 13 and the second fixed electrode plate 19b form the second acoustic sensing section 23b. The area of the first fixed electrode plate 19a is sufficiently larger than the area of the second fixed electrode plate 19b. The first acoustic sensing section 23a is a high-sensitivity sensing section for low sound volume. The second acoustic sensing section 23b is a low-sensitivity sensing section for high sound volume. In addition, the barrier electrode 34 is provided on the lower face of the back plate 18. As shown in FIGS. 22B and 23, the barrier electrode 34 is extended along the boundary portion between the first fixed electrode plate 19a and the second fixed electrode plate 19b.

An electrode pad 72 shown in FIG. 22A conducts with the second fixed electrode plate 19b. An electrode pad 73 conducts with the first fixed electrode plate 19a. An electrode pad 74 conducts with the diaphragm 13. An electrode pad 75 conducts with the barrier electrode 34. Alternatively, the barrier electrode 34 may be connected to the electrode pads 72 and 73 or the electrode pad 74, and be held at the reference potential (e.g., the ground potential) or at the same potential as the fixed electrode plates 32a and 32b.

In the acoustic sensor 71, when acoustic vibration having a high sound volume (high sound pressure) is added, the displaced diaphragm 13 can collide with the first fixed electrode plate 19a on the inner side. When the diaphragm 13 collides with the first fixed electrode plate 19a, a distortion signal can be transmitted from the first acoustic sensing section 23a on the high sensitivity side to the second acoustic sensing section 23b on the low sensitivity side. However, in the acoustic sensor 71, the barrier electrode 34 is provided between the first acoustic sensing section 23a and the second acoustic sensing section 23b. The distortion signal can thus be released from the barrier electrode 34 to the ground so as not to be transmitted from the first acoustic sensing section 23a to the second acoustic sensing section 23b. Therefore, the total harmonic distortion of the second acoustic sensing section 23b can be reduced.

Figure 24:
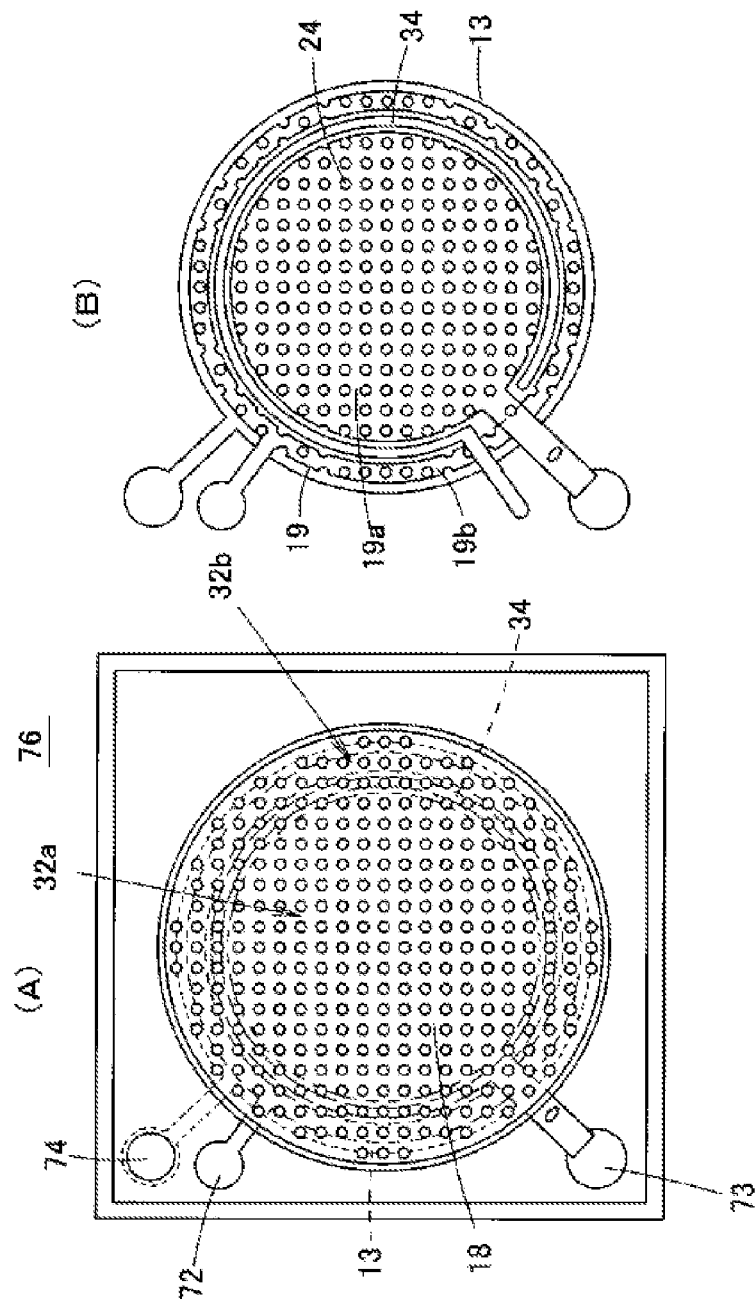
FIG. 24A is a plan view of the acoustic sensor according to a modification of the fifth embodiment of the present invention.
FIG. 24B is a plan view showing the fixed electrode plate, the diaphragm, and the barrier electrode of the acoustic sensor according to the modification of the fifth embodiment.

FIG. 24A is a plan view showing an acoustic sensor 76 according to a modification of the fifth embodiment of the present invention. FIG. 24B is a plan view showing the first fixed electrode plate 19a, the second fixed electrode plate 19b, the diaphragm 13, and the barrier electrode 34 of the acoustic sensor 76. This applies the structure of the fifth embodiment to the acoustic sensor 76 having the circular diaphragm 13.

Sixth Embodiment

Figure 25:
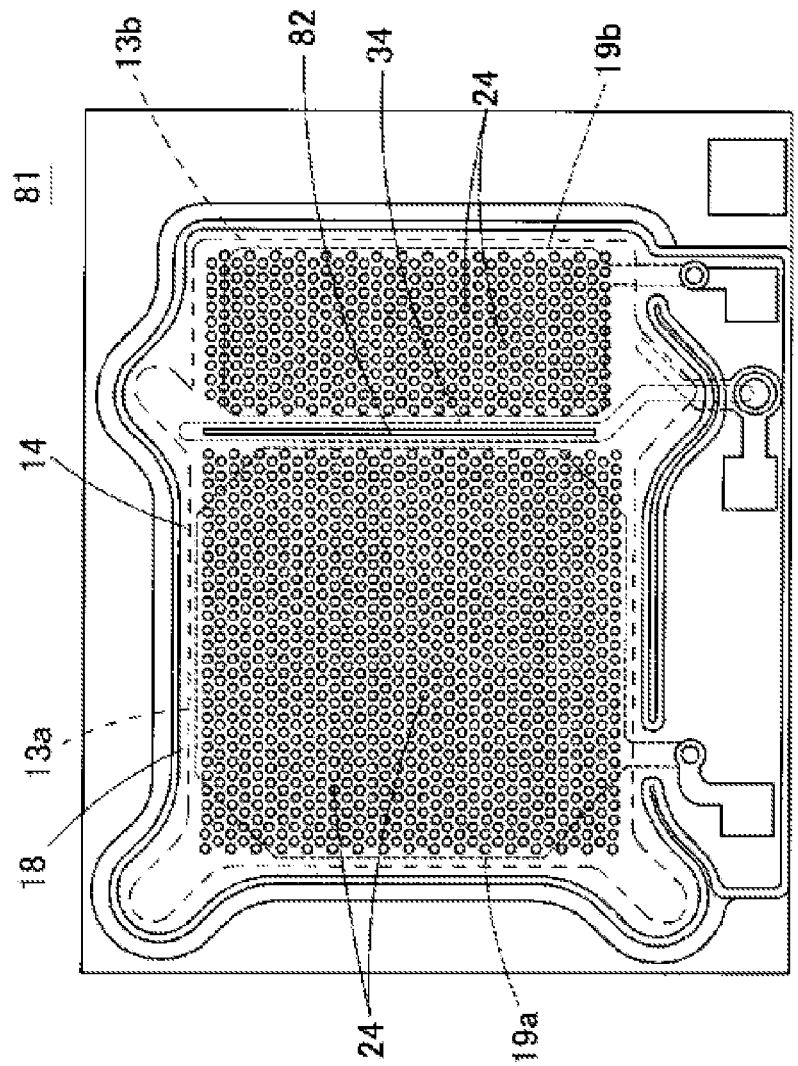
FIG. 25 is a plan view of an acoustic sensor according to a sixth embodiment of the present invention.
Figure 26:
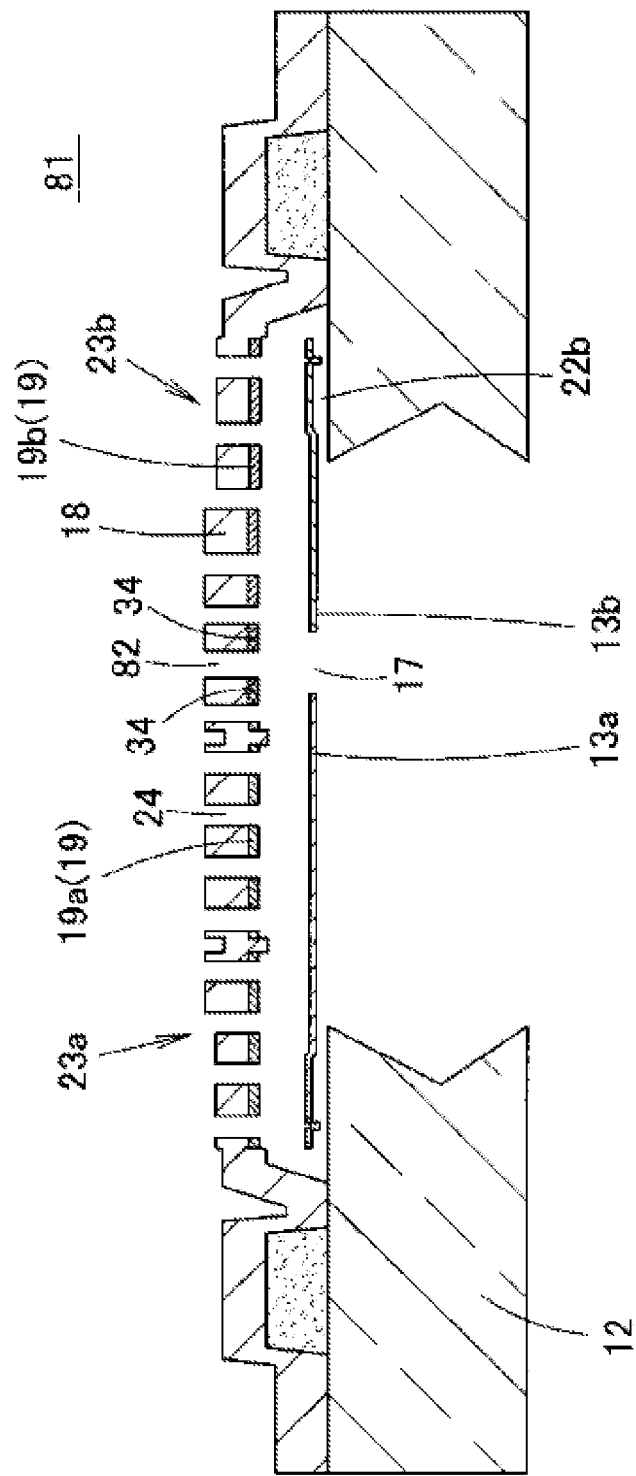
FIG. 26 is a cross-sectional view of the acoustic sensor shown in FIG. 25.

FIG. 25 is a plan view showing an acoustic sensor 81 according to a seventh embodiment of the present invention. FIG. 26 is a cross-sectional view of the acoustic sensor 81. The acoustic sensor 81 of the seventh embodiment is provided with a slit-like opening 82. The slit-like opening 82 passes through the center of the barrier electrode 34, and is extended vertically through the back plate 18 along the length direction of the barrier electrode 34.

When the first diaphragm 13a on the high sensitivity side collides with the back plate 18, an electric distortion signal is transmitted from the first acoustic sensing section 23a to the second acoustic sensing section 23b, as described above. The electric distortion signal is removed by the barrier electrode 34. However, the first diaphragm 13a which collides with the back plate 18 distorts the region of the back plate 18 opposite to the first diaphragm 13a. When the back plate 18 is continuous on the first acoustic sensing section 23a side and the second acoustic sensing section 23b side, the mechanical distortion is transmitted to the second diaphragm 13b below the back plate 18. Consequently, the output signal of the second acoustic sensing section 23b is distorted to deteriorate the total harmonic distortion.

On the contrary, the slit-like opening 82 is provided in the back plate 18 between the first acoustic sensing section 23a and the second acoustic sensing section 23b so that the back plate 18 is separated into the first acoustic sensing section 23a side and the second acoustic sensing section 23b side. The mechanical distortion is thus unlikely to be transmitted from the first acoustic sensing section 23a to the second acoustic sensing section 23b. Therefore, the total harmonic distortion in the second acoustic sensing section 23b can be prevented from being deteriorated.

Figure 27:
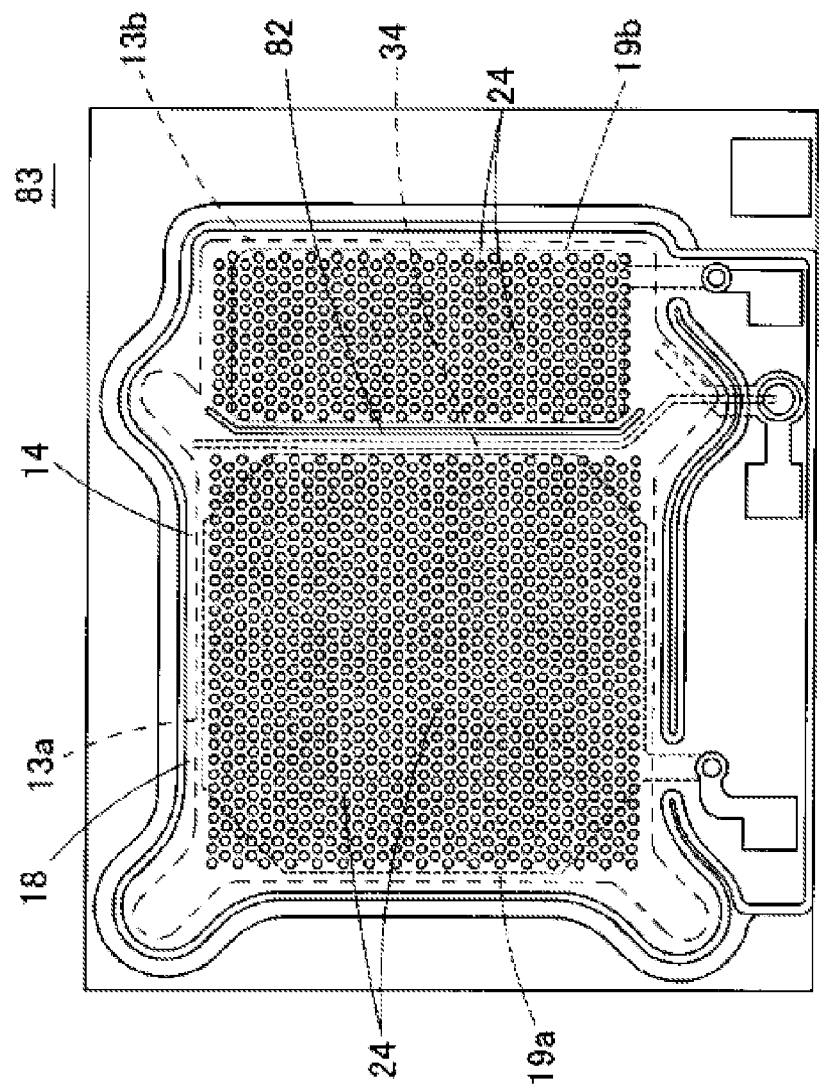
FIG. 27 is a plan view of the acoustic sensor according to another example of the sixth embodiment of the present invention.
Figure 28:
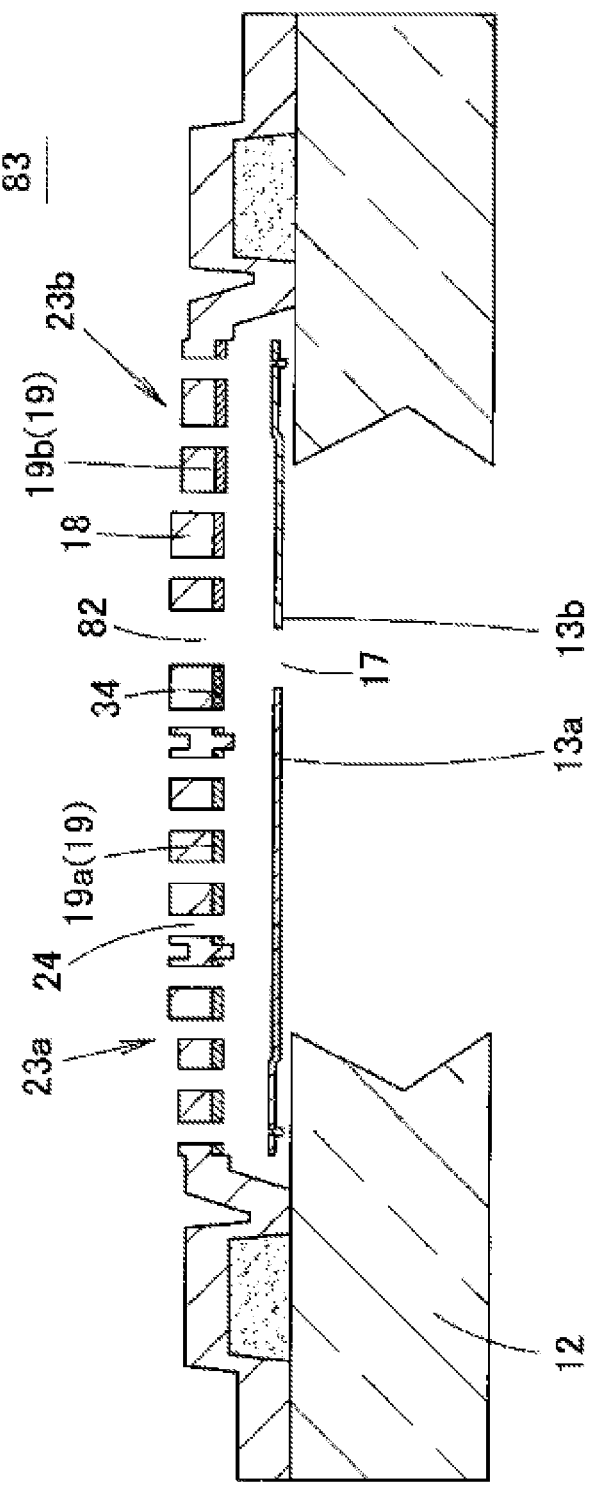
FIG. 28 is a cross-sectional view of the acoustic sensor shown in FIG. 27.

As shown in FIGS. 27 and 28, the slit-like opening 82 may be provided in parallel with the barrier electrode 34.

Seventh Embodiment

Figure 29:
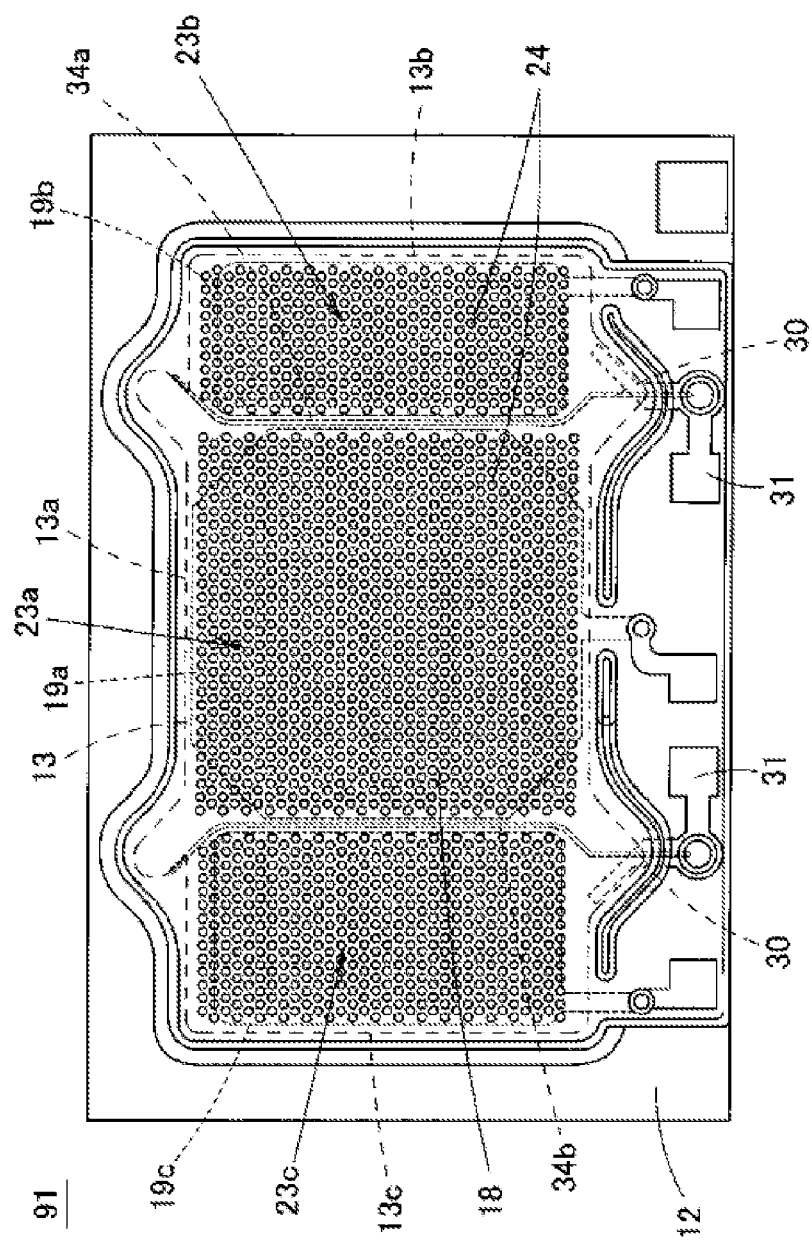
FIG. 29 is a plan view of an acoustic sensor according to a seventh embodiment of the present invention.
Figure 30:
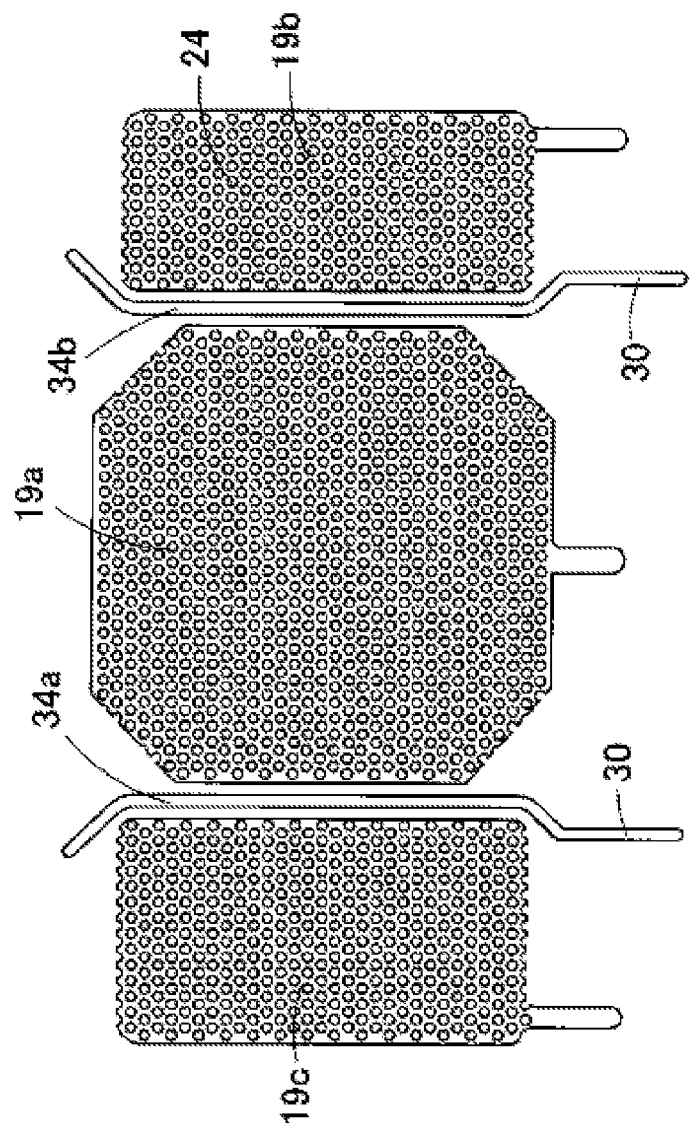
FIG. 30 is a plan view showing the structure of the fixed electrode plate of the acoustic sensor of the seventh embodiment.

FIG. 29 is a plan view showing the structure of an acoustic sensor 91 according to a seventh embodiment of the present invention. FIG. 30 shows the structures of the fixed electrode plate and the barrier electrode of the acoustic sensor 91. The acoustic sensor 91 has the first acoustic sensing section 23a, the second acoustic sensing section 23b, and a third acoustic sensing section 23c. The first acoustic sensing section 23a has a capacitor structure formed of the first diaphragm 13a and the first fixed electrode plate 19a, and is a high-sensitivity sensing section for low sound volume. The second acoustic sensing section 23b has a capacitor structure formed of the second diaphragm 13b and the second fixed electrode plate 19b, and is a low-sensitivity sensing section for high sound volume. The third acoustic sensing section 23c has a capacitor structure formed of a third diaphragm 13c and a third fixed electrode plate 19c, and is an intermediate-sensitivity sensing section for intermediate sound volume.

In the acoustic sensor 91, the diaphragm 13 in a substantially rectangular shape is disposed over the chamber 15 of the silicon substrate 12. The diaphragm 13 is separated into the first diaphragm 13a in a substantially rectangular shape and the second diaphragm 13b and the third diaphragm 13c in a substantially rectangular shape located both sides of the first diaphragm 13a by two slits (not shown). The area of the third diaphragm 13c is smaller than the area of the first diaphragm 13a. Further, the area of the second diaphragm 13b is smaller than the area of the third diaphragm 13c. The first fixed electrode plate 19a is arranged so as to be opposite to the first diaphragm 13a. Likewise, the second fixed electrode plate 19b is arranged so as to be opposite to the second diaphragm 13b. The third fixed electrode plate 19c is opposite to the third diaphragm 13c. The first fixed electrode plate 19a, the second fixed electrode plate 19b, and the third fixed electrode plate 19c are separated from each other, and are provided on the lower face of the back plate 18 fixed to the upper face of the silicon substrate 12 so as to cover the diaphragm 13.

A barrier electrode 34a is provided on the lower face of the back plate 18 so as to pass through between the first fixed electrode plate 19a and the second fixed electrode plate 19b. A barrier electrode 34b is provided so as to pass through between the first fixed electrode plate 19a and the third fixed electrode plate 19c. The barrier electrodes 34a and 34b are connected to the shared electrode pads 31 by the extraction wirings 30, and are held at the same reference potential as the diaphragm 13. Alternatively, the barrier electrodes 34a and 34b may be connected to electrode pads only for the barrier electrode 34, and may be independently held at the reference potential (e.g., the ground potential) or at the same potential as the first fixed electrode plate 19a, the second fixed electrode plate 19b, and the third fixed electrode plate 19c. Further, in the first acoustic sensing section 23a, the second acoustic sensing section 23b, and the third acoustic sensing section 23c, the acoustic perforations 24 are opened in the back plate 18, the first fixed electrode plate 19a, the second fixed electrode plate 19b, and the third fixed electrode plate 19c.

The acoustic sensor 91 which is provided with three (or more) acoustic sensing sections can output three (or more) detection signals. Therefore, the dynamic range of the acoustic sensor 91 can be wider, and the S/N ratio in each sound region can be improved. In addition, the barrier electrode 34a can release a distortion signal transmitted from the first acoustic sensing section 23a to the second acoustic sensing section 23b to the ground. The barrier electrode 34b can release a distortion signal transmitted from the first acoustic sensing section 23a to the third acoustic sensing section 23c to the ground. The output signals of the second acoustic sensing section 23b and the third acoustic sensing section 23c can be prevented from being distorted to reduce the total harmonic distortion, and sensitivity change due to a leak signal can be prevented.

The acoustic sensor and the microphone using the acoustic sensor have been described above. The present invention is applicable to a capacitance type sensor, other than the acoustic sensor, such as a pressure sensor.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

11, 61, 71, 76, 81, 91 Acoustic sensor
12 Silicon substrate
13 Diaphragm
13a First diaphragm
13b Second diaphragm
13c Third diaphragm
17 Slit
18 Back plate
19 Fixed electrode plate
19a First fixed electrode plate
19b Second fixed electrode plate
19c Third fixed electrode plate
23a First acoustic sensing section
23b Second acoustic sensing section
23c Third acoustic sensing section
25 Stopper
34 Barrier electrode
82 Slit-like opening

The invention claimed is:

1. A capacitance type sensor comprising:
   a substrate;
   a vibration electrode plate formed over the substrate;
   a back plate formed over the substrate so as to cover the vibration electrode plate; and
   a fixed electrode plate provided on the back plate so as to be opposite to the vibration electrode plate,
   wherein at least one of the vibration electrode plate and the fixed electrode plate is separated into a plurality of regions, each of the plurality of regions being formed with a sensing section including the vibration electrode plate and the fixed electrode plate, and
   wherein a barrier electrode is provided between respective sensing sections of at least one adjacent pair of regions of the plurality of regions to prevent signal interference between the respective sensing sections.

2. The capacitance type sensor according to claim 1,
   wherein the fixed electrode plate is separated into the plurality of regions, and
   wherein the barrier electrode is provided between the separated regions of the fixed electrode plate.

3. The capacitance type sensor according to claim 2, wherein the barrier electrode is located in the same plane as the fixed electrode plate.

4. The capacitance type sensor according to claim 2, wherein the barrier electrode is made of the same material as the fixed electrode plate.

5. The capacitance type sensor according to claim 2, wherein the barrier electrode surrounds at least one of the separated regions of the fixed electrode plate.

6. The capacitance type sensor according to claim 1, wherein the vibration electrode plate is separated into the plurality of regions, the barrier electrode being provided between the separated regions of the vibration electrode plate.

7. The capacitance type sensor according to claim 6, wherein the barrier electrode is located in the same plane as the vibration electrode plate.

8. The capacitance type sensor according to claim 6, wherein the barrier electrode is made of the same material as the vibration electrode plate.

9. The capacitance type sensor according to claim 6, wherein the barrier electrode surrounds at least one of the separated regions of the vibration electrode plate.

10. The capacitance type sensor according to claim 1, wherein the barrier electrode has conductivity.

11. The capacitance type sensor according to claim 1, wherein the barrier electrode is held at a reference potential or at the same potential as any one of the vibration electrode plate and the fixed electrode plate.

12. The capacitance type sensor according to claim 1, wherein the barrier electrode is longer than a length of one side of each of the separated regions of the vibration electrode plate or the fixed electrode plate.

13. The capacitance type sensor according to claim 1, wherein the end of the barrier electrode is formed in an arc shape.

14. The capacitance type sensor according to claim 2, wherein insulating stoppers are projected from the barrier electrode toward the vibration electrode plate.

15. The capacitance type sensor according to claim 2, wherein the insulating stoppers are projected from the region of the fixed electrode plate along the barrier electrode toward the vibration electrode plate.

16. The capacitance type sensor according to claim 2, wherein a slit-like opening is extended through the barrier electrode and the back plate along a length direction of the barrier electrode.

17. The capacitance type sensor according to claim 2, wherein the slit-like opening extended through the back plate is provided in the back plate so as to be in parallel with the length direction of the barrier electrode.

18. An acoustic sensor which uses the capacitance type sensor according to claim 1,
    wherein a plurality of perforations are formed in the back plate and the fixed electrode plate and pass acoustic vibration therethrough,
    wherein a signal is outputted from each sensing section according to the change in electrostatic capacitance between the vibration electrode plate which senses the acoustic vibration and the fixed electrode plate.

19. A microphone comprising:
    the acoustic sensor according to claim 18; and
    a circuit which amplifies the signal from the acoustic sensor to output the amplified signal to the outside.

* * * * *